United States Patent [19]
Osanai et al.

[11] Patent Number: 6,028,376
[45] Date of Patent: Feb. 22, 2000

[54] POSITIONING APPARATUS AND EXPOSURE APPARATUS USING THE SAME

[75] Inventors: Eiji Osanai, Yokohama; Kotaro Akutsu, Soka; Hirohito Ito, Funabashi, all of Japan

[73] Assignee: Canon Kabushiki Kaisha, Tokyo, Japan

[21] Appl. No.: 09/061,245

[22] Filed: Apr. 17, 1998

[30] Foreign Application Priority Data

| Apr. 22, 1997 | [JP] | Japan | 9-117409 |
| Oct. 1, 1997 | [JP] | Japan | 9-268665 |
| Dec. 26, 1997 | [JP] | Japan | 9-366721 |

[51] Int. Cl.[7] .................................................. H01L 21/00
[52] U.S. Cl. .......................... 310/12; 318/625; 318/135; 74/471 XY; 33/1 M
[58] Field of Search .............................. 310/12; 318/135, 318/574, 625; 33/1 M; 74/471 XY; 108/137, 138; 29/721, 760, 785

[56] References Cited

U.S. PATENT DOCUMENTS

| 5,040,431 | 8/1991 | Sakino et al. | 74/479 |
| 5,184,055 | 2/1993 | Ohishi et al. | 318/615 |
| 5,229,670 | 7/1993 | Kagawa | 310/12 |
| 5,280,677 | 1/1994 | Kubo et al. | 33/568 |
| 5,338,121 | 8/1994 | Kobayashi et al. | 310/12 X |
| 5,382,095 | 1/1995 | Akutsu | 384/100 |
| 5,524,502 | 6/1996 | Osanai | 74/490.07 |
| 5,610,686 | 3/1997 | Osanai | 355/72 |
| 5,701,041 | 12/1997 | Akutsu et al. | 310/12 |
| 5,717,482 | 2/1998 | Akutsu et al. | 355/53 |
| 5,726,548 | 3/1998 | Chiba et al. | 318/625 |

FOREIGN PATENT DOCUMENTS

| 3-21894 | 1/1991 | Japan . |
| 3-107639 | 5/1991 | Japan . |
| 3-125048 | 5/1991 | Japan . |
| 7-335538 | 12/1995 | Japan . |

*Primary Examiner*—Thomas M. Dougherty
*Assistant Examiner*—Judson H. Jones
*Attorney, Agent, or Firm*—Fitzpatrick, Cella, Harper & Scinto

[57] ABSTRACT

A positioning apparatus includes a movable stage, a first linear motor for moving the stage in a predetermined direction, a platform for supporting the first linear motor, and an inertial force application mechanism for applying a force for canceling a force acting on the platform, which is generated when the stage is moved by the first linear motor. The inertial force application mechanism includes a mass body, a guide for supporting and guiding the mass body, a second linear motor for moving the mass body, and a controller for controlling the second linear motor. Since the inertial force application mechanism of the positioning apparatus prevents transmission of vibration generated by an increase in an exciting force of the stage, rapid and precise positioning can be performed.

50 Claims, 24 Drawing Sheets

POSITIONING APPARATUS AND EXPOSURE APPARATUS USING THE SAME

BACKGROUND OF THE INVENTION

1. Field of the Invention

The present invention relates to an exposure apparatus used for lithography in manufacturing a semiconductor device, a positioning apparatus suitably used for positioning in various precision machine tools or precision measurement devices, and an exposure apparatus or device manufacturing method using this positioning apparatus.

2. Description of the Related Art

Conventionally, as an exposure apparatus used in manufacturing a semiconductor device, a so-called stepper is known. The stepper projects a reduced image of a pattern formed on a reticle onto a semiconductor wafer through a projecting lens and sequentially exposes the pattern to a plurality of positions on the wafer while moving the wafer stepwise under the projecting lens. The stepper is regarded as a mainstream exposure apparatus because of its performance in resolution and overlay accuracy.

FIG. 24 is a front view showing the main body structure and wafer stage arrangement example of a conventional exposure apparatus.

In FIG. 24, reference numeral 1 denotes an illumination unit for illuminating a reticle pattern; 2, a reticle having a pattern to be transferred; 3, a projecting lens for projecting the pattern formed on the reticle 2 onto a wafer; 4, a lens-barrel holder supporting the projecting lens; 5, a top stage movable in the θ, Z, α, and β directions, on which a wafer (not shown) is to be mounted; 6, an X-Y stage movable in the X and Y directions, on which the top stage 5 is mounted; 8, a stage base having a guide surface on its upper surface and supporting the X-Y stage 6 and a movable guide 7 in a non-contact state in the Z direction through static pressure air bearing portions; 9, a platform integrated with the lens-barrel holder 4, on which the stage base 8 is mounted and stationarily supported; and 11, air mounts arranged at four positions to support the lens-barrel holder 4. The lens-barrel holder 4 is supported by the air mounts 11 through the platform 9. Reference numeral 33a denotes a laser interferometer for measuring the relative positions of the projecting lens 3 and the X-Y stage 6; 16a, a light-projecting portion of a focus detection unit for measuring the distance between the focal position of the projecting lens 3 and the upper surface of the wafer; and 16b, a light-receiving portion of the focus detection unit.

For the purpose of increasing the area of a semiconductor device and reducing cost, the exposure apparatus having the above arrangement tends to use a large-diameter/size semiconductor wafer. In addition, along with an increase in integration density of a semiconductor device, a strong demand for high-speed and high-precision wafer stage positioning and a high throughput has arisen.

However, to rapidly and precisely move the X-Y stage 6 in such a conventional exposure apparatus to cope with a large-diameter semiconductor wafer to be mounted, the dynamic characteristics of the X-Y stage 6 must be improved. This requires a higher guide rigidity, so the increase in stage weight is inevitably more than the increase in weight due to stroke up. When the moving acceleration and moving speed of the X-Y stage 6 are increased to shorten the moving time to obtain a high throughput, the exciting force generated by the stage moving acceleration becomes larger. In addition to the relative decrease in rigidity of the structure such as the lens holder due to the increase in weight of the projecting lens 3, the prior art has the following problems.

A stronger structure results in a bulky apparatus and an increase in cost.

As the exciting force increases, the characteristic vibration of the entire apparatus supported by the anti-vibration mounts 11 or the mechanical system incorporated in the apparatus is excited. Disturbance vibration is transmitted to the top stage 5 or the laser interferometer 33a, so rapid and precise positioning is impeded.

When the X-Y stage 6 moves, the center of gravity of the entire apparatus which is supported by the lens-barrel holder 4 and the platform 9 changes in the X and Y directions due to the weight of the stage itself, so the distribution of supporting forces of the plurality of air mounts 11 changes. Such a change in supporting force balance deforms the lens-barrel holder 4 which serves as the reference of the focus sensors 16a and 16b and the laser interferometer 33a for measuring the position and posture of the X-Y stage 6, thus degrading the overlay accuracy of a wafer or the like.

In a positioning apparatus disclosed in, e.g., U.S. Pat. No. 5,610,686 or Japanese Laid-Open No. 7-335538, a linear motor applies an acceleration to the stage in correspondence with vibration of the base to prevent a relative shift between the base and the stage due to vibration of the base upon driving the stage on the base.

However, when the stage moves, the center of gravity of the entire apparatus changes in the X and Y directions due to the weight of the stage itself, so the distribution of supporting forces of a plurality of holders supporting the entire positioning apparatus changes. Such a change in supporting force balance deforms a holder which serves as the reference of the focus sensors and the laser interferometer for measuring the position and posture of the X-Y stage, thus degrading the overlay accuracy of wafer or the like.

In the above prior art described in Japanese Laid-open No. 7-335538, an acceleration is given by a linear motor to cancel the driving reaction force of the stage which is driven by a ball screw. However, when two actuators (the ball screw and linear motor) are attached to one stator or table, the acceleration is not satisfactorily transmitted, so this system can hardly be realized. Because the actuator (linear motor) is different from the driver of the stage (ball screw), it is very difficult to properly cancel a small vibration and a driving reaction force of the stage.

In a positioning apparatus disclosed in Japanese Patent Laid-Open No. 3-21894, 3-107639, or 3-125048, a balance member is driven by a ball screw to apply an acceleration corresponding to vibration to the base or stage in order to prevent vibration of the base or stage.

However, since the ball screw is used to move the stage or balance member, a moment is generated around the shaft of the ball screw. The rotational moment may act on the base or stage to generate disturbance vibration, resulting in a decrease in stage positioning accuracy. In addition, a lubricant or the like is required for use of a ball screw, so the stage cleanness or maintenance properties become lower.

Furthermore, a system using a ball screw subjected to mechanical contact cannot completely suppress characteristic vibration, so residual vibration is generated. Therefore, a more advanced control system must be constructed for the balance member.

In recent years, the line width of the integration circuit of a semiconductor wafer has been reduced to the submicron order. Excitation of such vibration by a ball screw largely adversely affects the performance of an exposure apparatus.

SUMMARY OF THE INVENTION

The present invention has been made in consideration of the above situation, and has as its object to provide a simple arrangement for allowing rapid and precise positioning while preventing transmission of vibration due to an increase in stage exciting force.

It is another object of the present invention to provide an apparatus for two-dimensionally positioning a stage, which allows rapid and precise positioning while keeping the center of gravity of the entire apparatus unchanged.

In order to achieve the above object, according to an aspect of the present invention, there is provided a positioning apparatus comprising: a platform having a reference surface; a movable stage; a first linear motor for moving the stage in a predetermined direction; and inertial force application means for generating an inertial force, the inertial force application means comprising a mass body, a guide for supporting and guiding the mass body, a second linear motor for moving the mass body, and control means for controlling the second linear motor.

According to another aspect of the present invention, there is provided an exposure apparatus to which the above-described positioning apparatus is applied.

According to still another aspect of the present invention, there is provided a method of manufacturing a semiconductor device using the above-described exposure apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

<First Embodiment>

Figure 1:
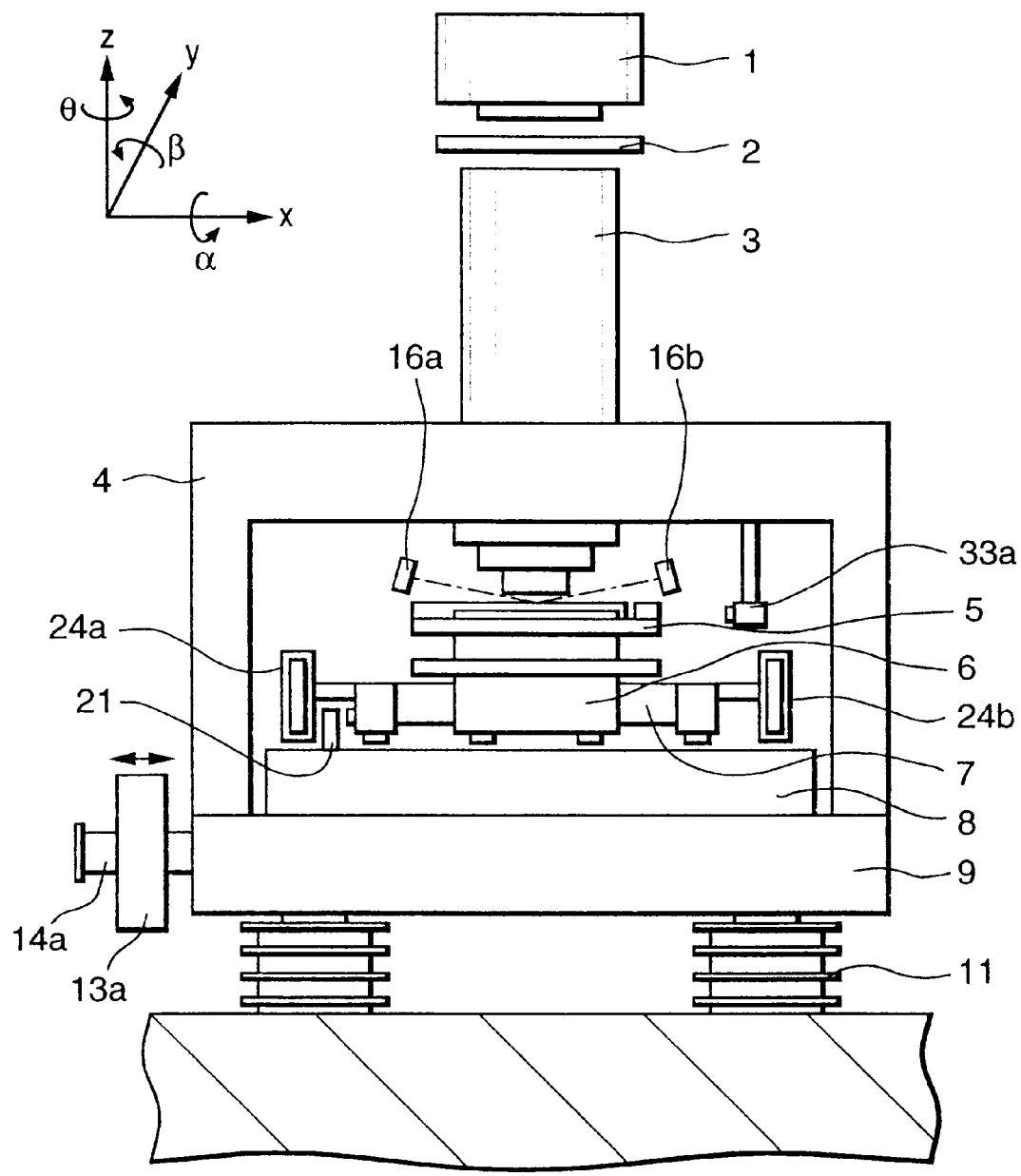
FIG. 1 is a front view showing a projecting exposure apparatus of the first embodiment.

In the following description of the embodiment, the present invention is applied to a positioning apparatus for a projecting exposure apparatus used for lithography of a semiconductor device. As shown in FIG. 1, the projecting exposure apparatus of the first embodiment comprises a projecting optical system 3, a stage 6 on which a semiconductor wafer is to be mounted, a stage moving mechanism for one- or two-dimensionally moving the stage on an orthogonal plane with respect to the projecting optical system 3, a lens-barrel holder 4 supporting the projecting optical system 3, a stage base 8 supporting the stage moving mechanism, and an inertial force application mechanism attached to the stage base 8.

The lens-barrel holder 4 and the stage base 8 are integrally coupled through a platform 9. The platform 9 is supported by air mounts 11. Alternatively, a base 12 for mounting the lens-barrel holder 4 and the stage base 8 may be arranged, and the lens-barrel holder 4 and the stage base 8 may be separated by the air mounts 11 and 81. This arrangement will be described later in the second embodiment.

Four inertial force application mechanisms are arranged near the plane of action of an inertial force corresponding to the acceleration/deceleration of the stage 6, i.e., the stage base 8 or the platform 9, and driven/controlled to cancel the inertial force of the stage. Each inertial force application mechanism is constituted by a mass body 13, a guide 14 for supporting/guiding the mass body 13, linear motors 52 and 53 for moving the mass body 13, and a control unit for controlling the linear motors (a controller 153 and a mass body driving unit 155 to be described in FIG. 5). The guide 14 includes a static pressure air bearing 51 to be described in FIG. 3. The first embodiment will be described below in detail.

Figure 2:
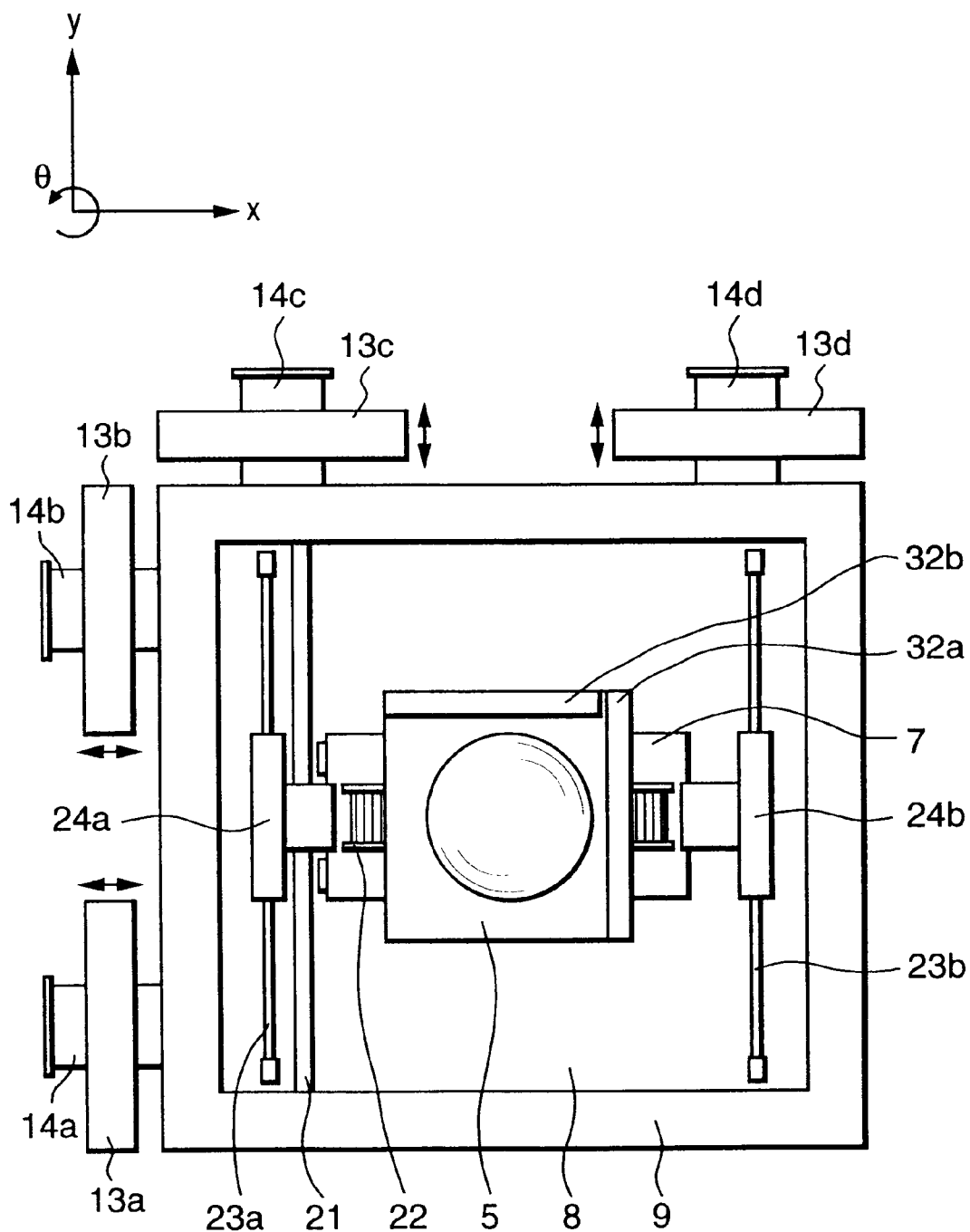
FIG. 2 is a plan view of the wafer mounting stage portion of the projecting exposure apparatus shown in FIG. 1.

FIG. 1 is a front view of the projecting exposure apparatus according to the first embodiment of the present invention. FIG. 2 is a plan view of the stage portion shown in FIG. 1. Referring to FIGS. 1 and 2, reference numeral 2 denotes a reticle having a pattern to be transferred; 1, an illumination unit for illuminating the reticle 2 with exposure light, which includes a light source and an illumination lens; 3, the projecting lens for projecting the pattern formed on the reticle 2 onto a wafer; and 4, the lens-barrel holder supporting the projecting lens.

Reference numeral 5 denotes a top stage movable in the θ, Z, α, and β directions, on which a wafer (not shown) is to be mounted; 6, the X-Y stage movable in the X and Y directions, on which the top stage 5 is mounted; 7, a movable guide supporting the X-Y stage 6 in a non-contact state in the Y direction through static pressure air bearing portions to guide the X-Y stage 6 in the X direction; 8, the stage base having a guide surface on the upper surface and supporting the X-Y stage 6 and the movable guide 7 in a non-contact state in the Z direction through static pressure air bearing portions; 21, a yaw guide integrated with the stage base 8 and supporting the movable guide 7 in a non-contact state in the X direction to guide the movable guide 7 in the Y direction. Reference numeral 22 denotes a stator of a linear motor for driving the X-Y stage 6 in the X direction. The stator 22 of the linear motor is fixed to the movable guide 7, and the movable element (not shown) of the linear motor is attached to the X-Y stage 6. Reference numerals 23a and 23b denote stators of a linear motor for driving the movable guide 7 in the Y direction, which are fixed to the stage base 8 to oppose each other. Reference numerals 24a and 24b denote movable elements of the linear motor for driving the movable guide 7 in the Y direction, which are attached to the movable guide 7 to oppose each other.

The stage base 8 is mounted on the platform 9, and the platform 9 and the lens-barrel holder 4 are integrally coupled. The platform 9 and the stage base 8 are also integrally coupled. Reference numeral 11 denotes one of four air mounts (dampers) arranged to support the lens-barrel holder 4 and the platform 9. The air mounts 11 insulate vibration transmitted from the floor to the lens-barrel holder 4 and the platform 9.

Reference numeral 33a denotes a laser interferometer for measuring the relative positions of the projecting lens 3 and the X-Y stage 6; 16a, a light-projecting portion of a focus detection unit for measuring the distance between the focal position of the projecting lens 3 and the upper surface of the wafer; and 16b, a light-receiving portion of the focus detection unit. The light-projecting portion 16a and the light-receiving portion 16b are fixed to the projecting lens 3. Reference numerals 32a and 32b denote reflection mirrors attached to the top stage 5.

Reference numeral 13 (13a, 13b, 13c, or 13d) denotes the mass body for applying an inertial force to the platform 9; and 14 (14a, 14b, 14c, or 14d), the guide supporting the mass body 13 and fixed to the platform 9 to guide the mass body 13.

Figure 3:
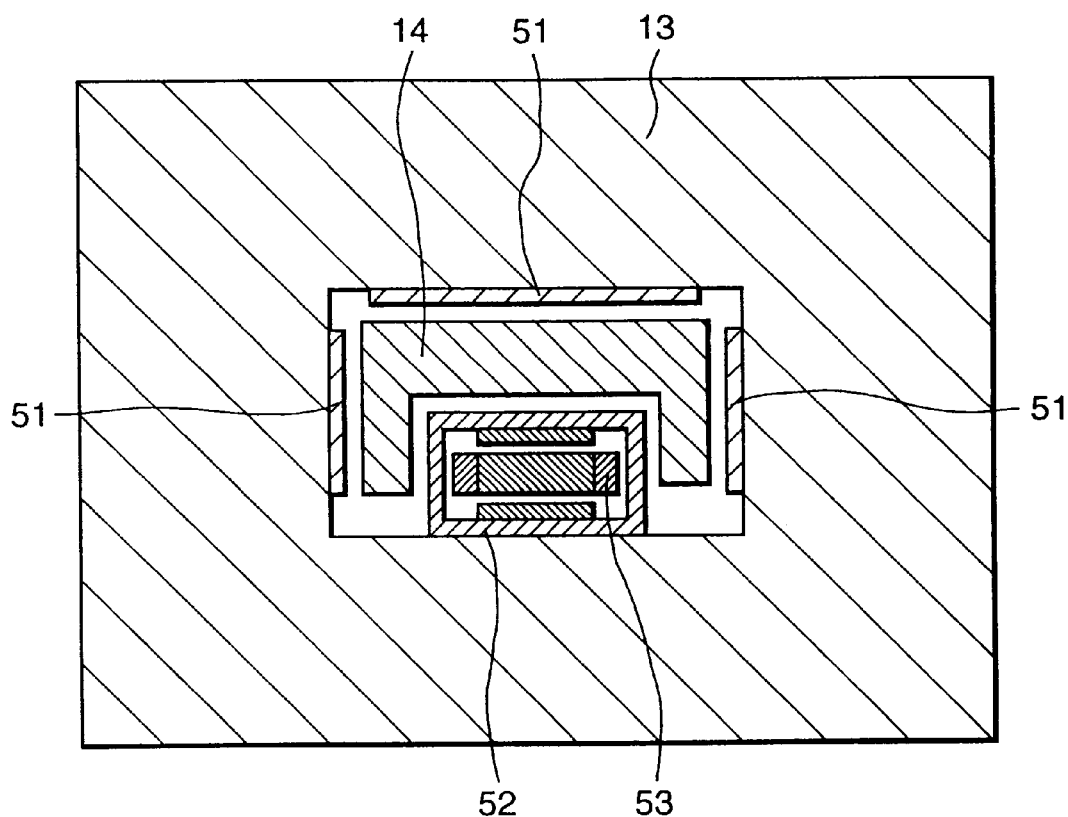
FIG. 3 is a sectional view showing details of the arrangement of a mass body and its guide portion in the projecting exposure apparatus shown in FIG. 1.

FIG. 3 is a sectional view showing details of the arrangement of the inertial force application mechanism. In FIG. 3, reference numeral 51 denotes the static pressure air bearing supporting the mass body 13 to guide it in an axial direction; 52, the movable element of a linear motor for driving the mass body 13, which is fixed to the mass body; and 53, the stator of the linear motor, which is fixed to the guide 14 at its one or two ends.

The axis of action of the driving force of the linear motor preferably almost matches the center of gravity of the mass body. In this embodiment, a square pipe mass body is employed to satisfy the above condition. However, the shape of the mass body is not limited to this.

Figure 4:
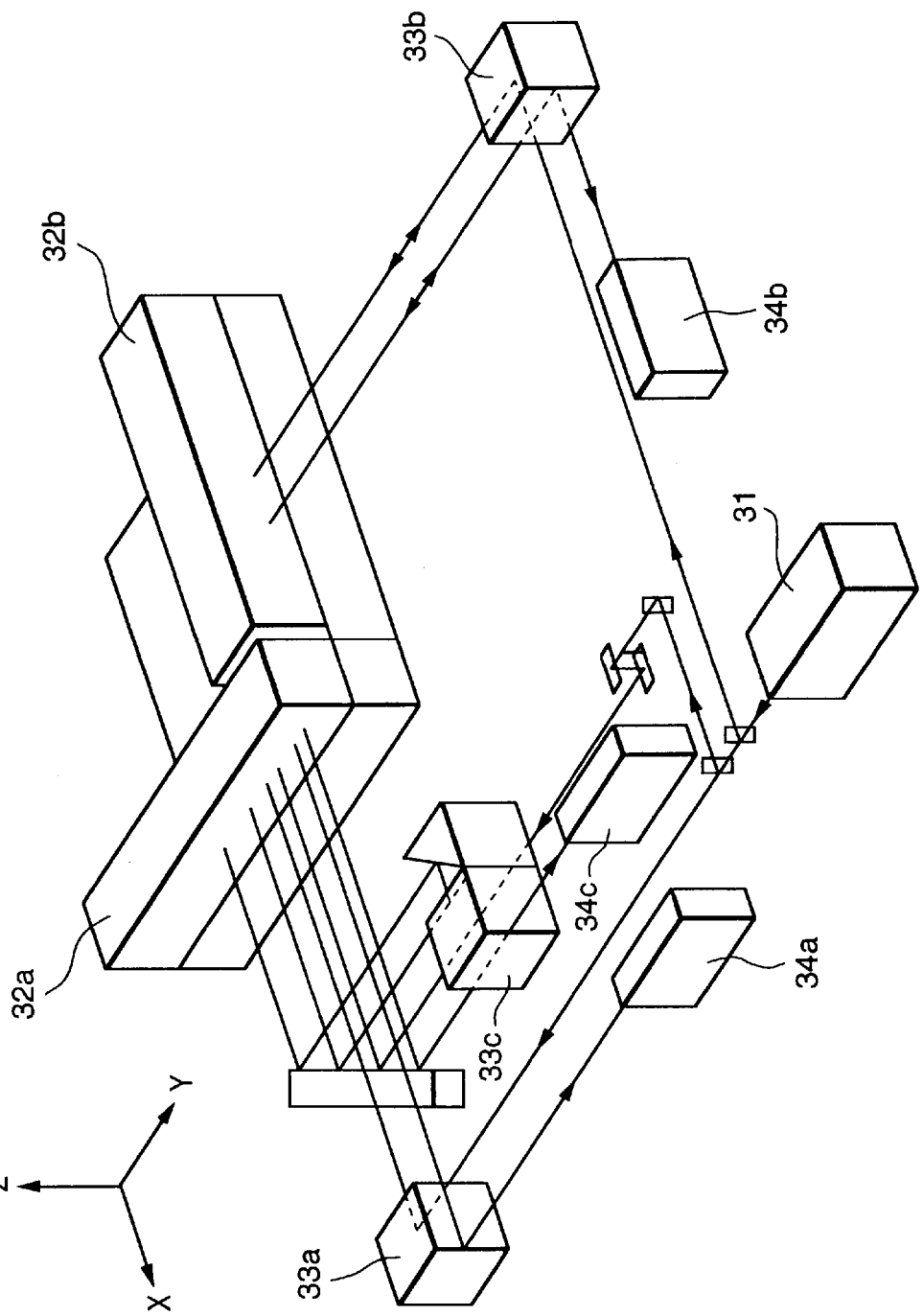
FIG. 4 is a perspective view for explaining the arrangement of a laser measurement system in the projecting exposure apparatus shown in FIG. 1.

FIG. 4 is a perspective view showing the arrangement of an X-Y stage measurement system (laser measurement system) of the exposure apparatus of this embodiment. FIG. 4 shows details of the laser interferometer 33a and the like around the top stage 5 shown in FIG. 1.

Referring to FIG. 4, reference numeral 31 denotes a laser head as a light source; 32a and 32b, the reflection mirrors attached to the top stage 5 shown in FIG. 1; 33a, the laser interferometer for measuring movement in the X direction; 33b, an interferometer for measuring movement in the Y direction; 33c, an interferometer for measuring yawing of the top stage 5, i.e., movement in the θ direction with respect to the optical axis of the projecting lens; and 34a to 34c, receivers for converting interference fringes in the X, Y, and θ directions into electrical signals, respectively.

Figure 5:
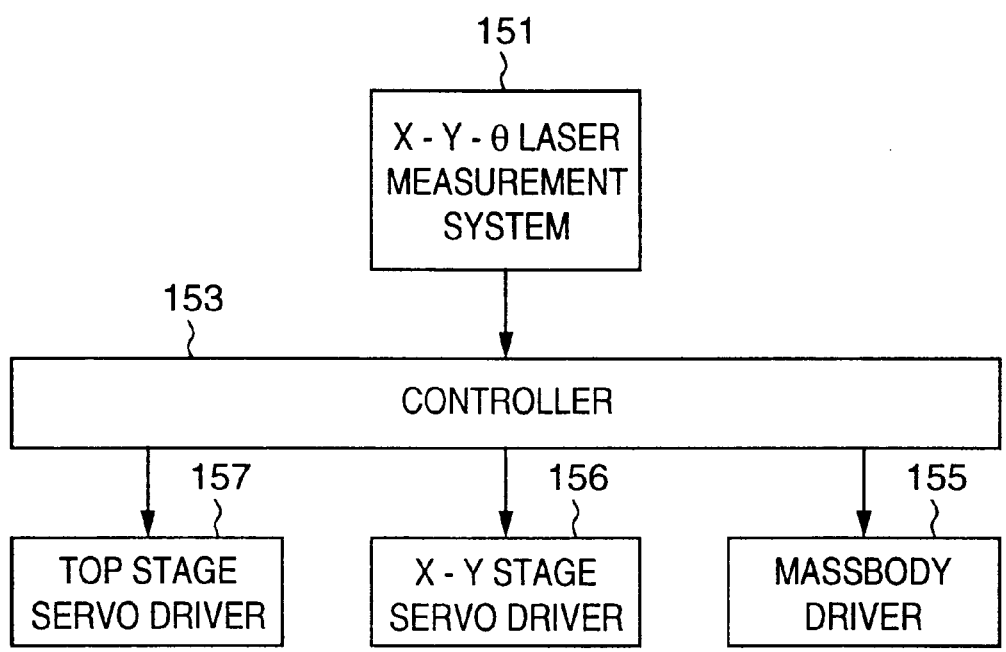
FIG. 5 is a block diagram showing the arrangement of the control system of the projecting exposure apparatus shown in FIG. 1.

FIG. 5 is a block diagram of the control system of this embodiment. Referring to FIG. 5, an X-Y-θ laser measurement system 151 shown in FIG. 3 measures the position of the X-Y stage 6 on which the top stage 5 is mounted. The controller 153 feeds back the position signals (x, y, and θ) of the X-Y stage 6 and the top stage 5 and outputs a predetermined operation instruction to each driving shaft. A driver 156 flows a current to the coil portions of the linear motor stators 22, 23a, and 23b shown in FIG. 2 on the basis of the instruction signal from the controller 153 to drive the X-Y stage 6. The driver 155 drives the mass body 13 (13a, 13b, 13c, or 13d) shown in FIG. 1 in response to the instruction from the controller 153. A driver 157 drives the respective driving shafts of the top stage 5. Driving control of the mass body 13 is performed by measuring (not shown) the position or acceleration of the mass body 13 and feeding it back.

In the above arrangement, first, a wafer (not shown) to be exposed is mounted on the top stage 5. The controller 153 (FIG. 3) supplies a driving signal to the X-Y stage 6 and the top stage 5 to drive the wafer to a predetermined position and posture under the projecting lens 3. At this time, deviations from the target position of the wafer in the X, Y, and Z directions and in the rotational directions (α, β, and θ directions) are calculated by the controller 153 and an external controller on the basis of the outputs from the laser measurement system and the focus detection system and fed back to the corresponding driving units such as the X-Y stage driver 156 and the top stage driver 157, so that the wafer is positioned/controlled to a predetermined position and posture. After the exposure, the wafer (top stage 5) is moved to the next predetermined position and exposed, and this operation is repeated.

The X-Y stage 6 is moved when an instruction signal is supplied from the controller 153 to the driver 156 in accordance with a predetermined velocity curve, and the linear motor generates a driving force corresponding to the instruction signal. The magnitude of the driving force equals an inertial force defined by the mass and predetermined acceleration/deceleration of the X-Y stage 6. The driving reaction force acts on the stage base 8 and is transmitted to the platform 9. At this time, an instruction signal is supplied from the controller 153 to the mass body driver 155 to cancel the driving reaction force, so the mass bodies 13a to 13d are driven to minimize the displacement of the platform 9.

Figure 6:
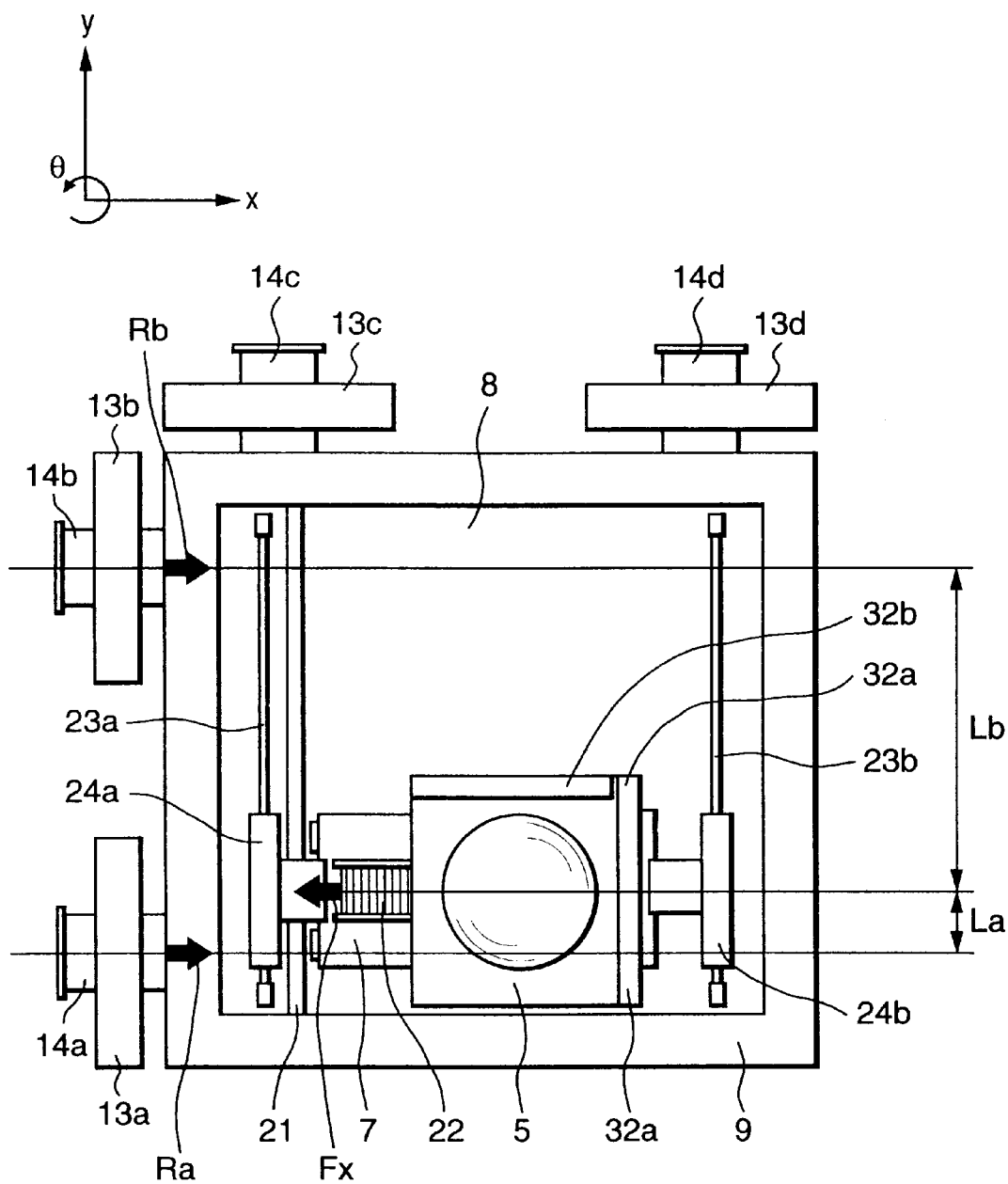
FIG. 6 is a plan view for explaining the X-direction action and reaction at the wafer mounting stage portion of the projecting exposure apparatus shown in FIG. 1.

For example, the instruction signal is obtained in the following manner. In FIG. 6, assume driving in the X direction. Let Fx be the reaction force in driving the X-Y stage 6 and the top stage 5, Ra and Rb be the reaction forces generated upon driving the mass bodies 13a and 13b, and La and Lb be the distances between the central shaft of the linear motor stator 22 on the movable guide 7 and the moving shafts of the mass bodies 13a and 13b. The distances La and Lb between the points of action of the respective forces can be obtained in advance. The reaction forces Ra and Rb are given by equations (1) below on the basis of the balance of force and balance of moment:

$$Ra = -\frac{Lb}{(La+Lb)}Fx \quad (1)$$

$$Rb = -\frac{La}{(La+Lb)}Fx$$

Let Ma and Mb be the masses of the mass bodies 13a and 13b, and Mx be the moving body mass of the top stage 5 and the X-Y stage 6 in the X direction. Necessary driving strokes Sa and Sb of the mass bodies 13a and 13b are determined by the mass ratio to a stroke Sx of the X-Y stage in the X direction. The necessary maximum strokes are represented by inequalities (2):

$$Sa \le \frac{Mx}{Ma}Sx \quad (2)$$

$$Sb \le \frac{Mx}{Mb}Sx$$

Figure 7:
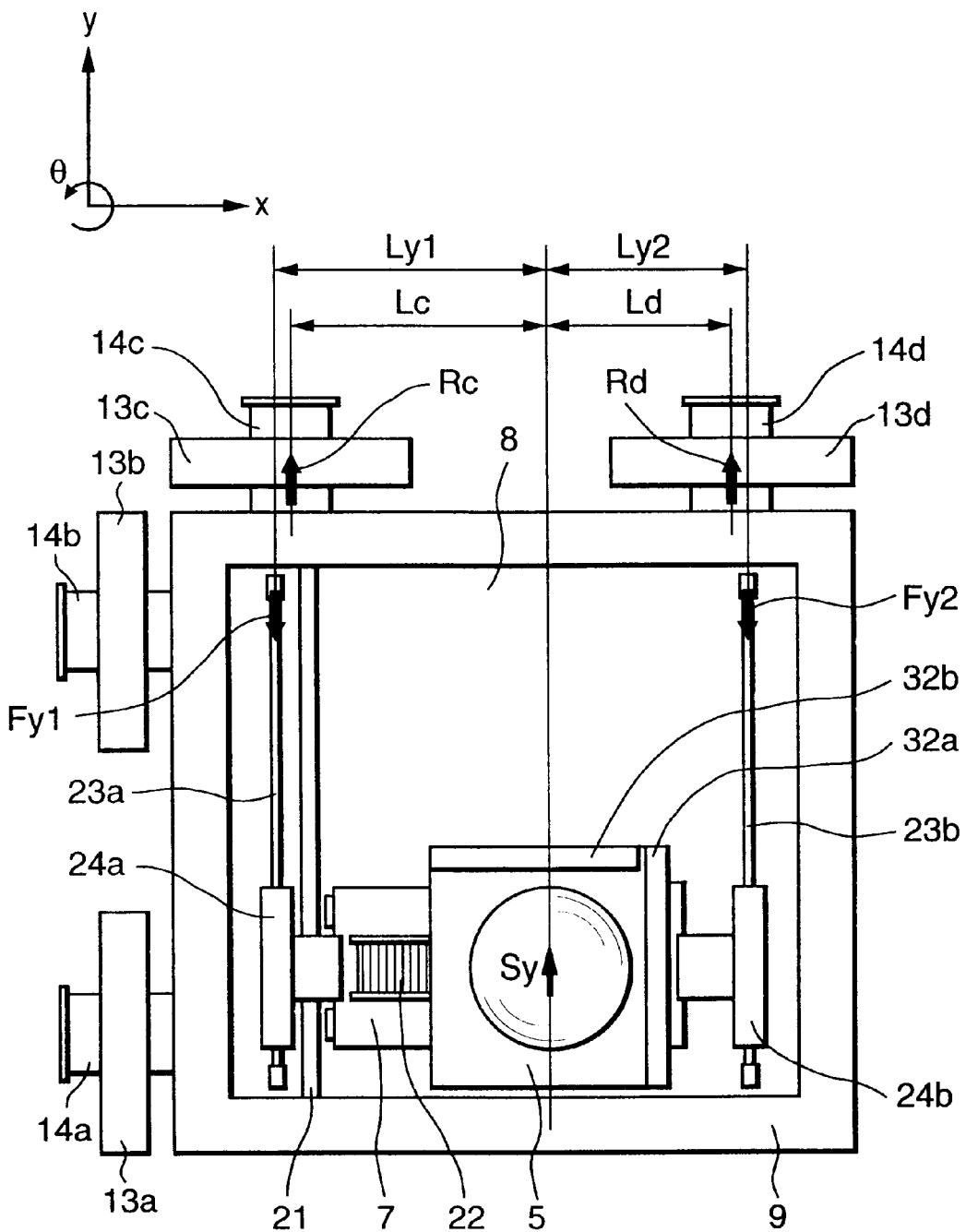
FIG. 7 is a plan view for explaining the Y-direction action and reaction at the wafer mounting stage portion of the projecting exposure apparatus shown in FIG. 1.

As shown in FIG. 7, in driving in the Y direction as well, let Fy1 and Fy2 be the driving reaction forces, Rc and Rd be the reaction forces generated upon driving the mass bodies 13c and 13d, and Ly1, Ly2, Lc, and Ld be the distances between the central shaft of the top stage 5 and the Y-direction driving shaft of the top stage 5, and the driving shafts of the mass bodies 13c and 13d. The reaction forces Rc and Rd are given by equations (3):

$$Rc = \frac{-Fy1(Ly1 + Ld) + Fy2(Ly2 - Ld)}{(Lc + Ld)} \quad (3)$$

$$Rd = \frac{Fy1(Ly1 - Lc) - Fy2(Ly2 + Lc)}{(Lc + Ld)}$$

Let Mc and Md be the masses of the mass bodies 13c and 13d, and My be the moving body mass of the top stage 5, the X-Y stage 6, and the movable guide 7 in the Y direction. Necessary driving strokes Sc and Sd of the mass bodies 13c and 13d are determined by the mass ratio with respect to a stroke Sy of the X-Y stage in the Y direction. The necessary maximum strokes are represented by inequalities (4):

$$Sc \le \frac{Mc}{My}Sy \quad (4)$$

-continued $$Sd \le \frac{Md}{My}Sy$$

As described above, the large X-, Y-, and θ-direction driving reaction forces acting on the platform 9 through the stage base 8 at the time of acceleration/deceleration are canceled by driving the mass bodies 13a to 13d in reverse directions to generate driving reaction forces in reverse directions, so the lens-barrel holder 4 does not swing. The moment reaction forces in the α and β directions are transmitted to the platform 9 to swing the lens-barrel holder 4, although these reaction forces are much smaller than those in other directions.

Therefore, the characteristic vibrations of the entire apparatus supported by the air mounts 11 and various portions of the mechanical system incorporated in the apparatus are not excited, so no disturbance vibration is transmitted to the wafer stage, the laser measurement system, or the focus detection system.

This embodiment is characterized in that large reaction forces (X, Y, and θ directions) to be transmitted to the stage base 8 in correspondence with the inertial force generated upon accelerating/decelerating the X-Y stage 6 are canceled by driving the mass bodies 13a to 13d attached to the platform 9. With this arrangement, the characteristic vibrations of the entire apparatus supported by the air mounts 11 and various portions of the mechanical system incorporated in the apparatus are not excited. Since no disturbance vibration is transmitted to the wafer stage, the laser measurement system, or the focus detection system, rapid and precise positioning can be realized.

In this embodiment, the linear motor is used to drive the stage and the mass bodies. Since rotational motion like a ball screw is not generated, no rotational moment is transmitted to the platform or stage, and disturbance vibration is reduced, so rapid and precise exposure can be performed. In addition, since both the stage and the mass bodies can be driven in a non-contact state, residual vibration of characteristic vibration which is likely to occur in a ball screw can be suppressed. Furthermore, both the stage and the mass bodies are driven by linear motors, so small vibration which can hardly be canceled using different types of driving means can be easily canceled.

<Second Embodiment>

Figure 8:
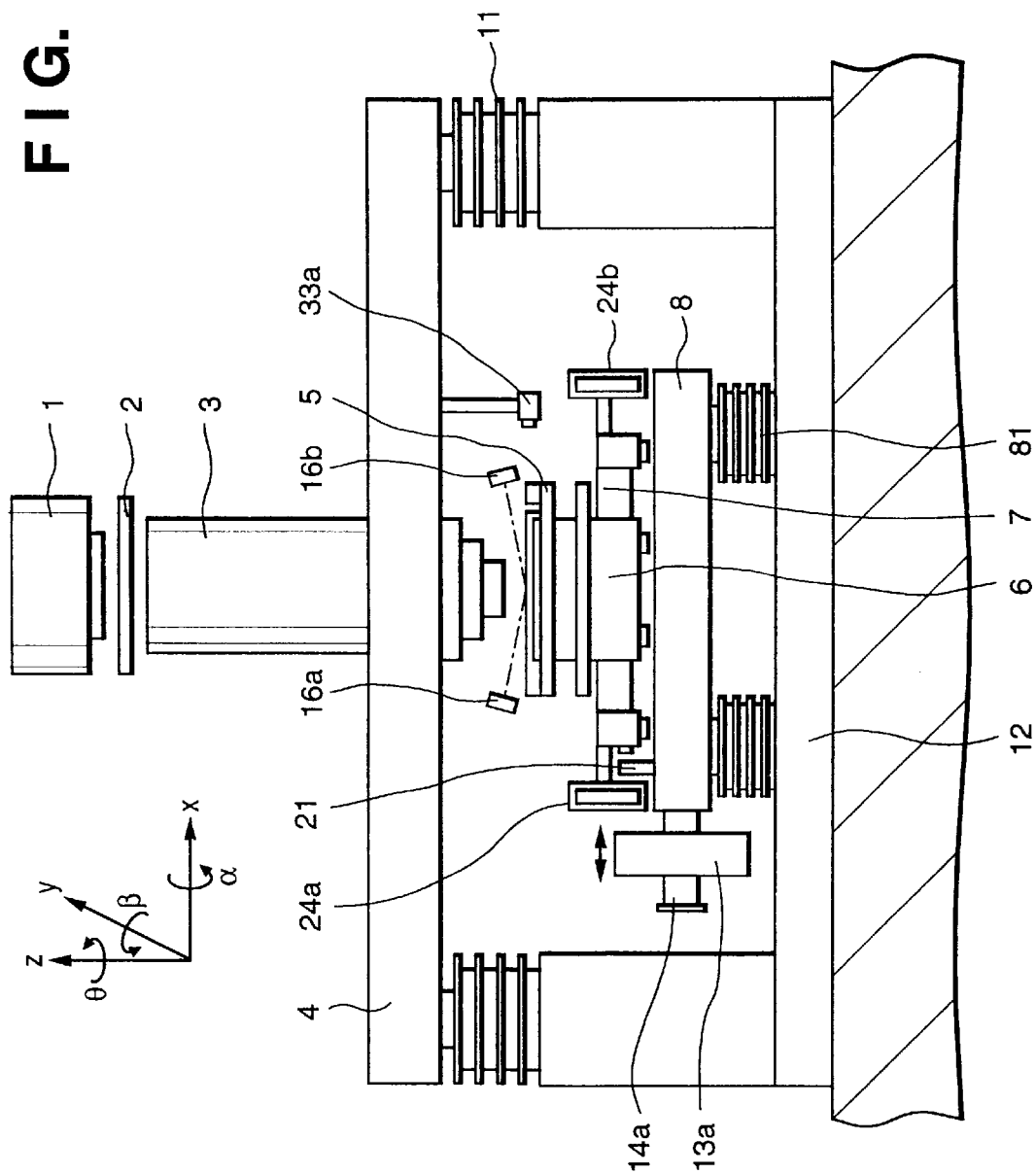
FIG. 8 is a front view showing a projecting exposure apparatus according to the second embodiment.

FIG. 8 is a front view of an apparatus according to the second embodiment of the present invention. The same reference numerals as in the first embodiment shown in FIGS. 1 to 7 denote the same members in FIG. 8. Referring to FIG. 8, reference numeral 81 denotes an air mount arranged at each of three or more portions to support a stage base 8; and 12, a base supporting a lens-barrel holder 4 through air mounts 11 and also supporting the stage base 8 through the airmounts 81. Guides 14a to 14d constituting an inertial force application mechanism are fixed to the stage base 8.

In the exposure apparatus having the above arrangement, mass bodies 13 (13a to 13d) are driven in correspondence with the acceleration/deceleration in moving an X-Y stage 6 and a top stage 5 to predetermined positions to directly apply an inertial force to the stage base 8, so the stage base 8 does not swing, as in the first embodiment. Therefore, the characteristic vibration of the wafer stage supported by the air mounts 81 is not excited. In addition, since the lens-barrel holder 4 is vibration-insulated from the wafer stage by the air mounts 81 and 11, the characteristic vibrations of the various portions of the mechanical system in the apparatus are not excited, so no disturbance vibration is transmitted to the laser measurement system or the focus detection system.

This embodiment has the following characteristic feature. In the exposure apparatus whose lens-barrel holder and wafer stage are formed as independent units, the mass bodies 13 (13a to 13d) attached to the stage base 8 are driven to cancel large reaction forces (x, Y, and θ directions) generated when the inertial force generated upon accelerating/decelerating the X-Y stage 6 is transmitted to the stage base 8, so that the characteristic vibration of the wafer stage supported by the air mounts 81 is not excited. In addition, the lens-barrel holder 4 is vibration-insulated from the wafer stage by the air mounts 81 and 11 such that the characteristic vibrations of various portions of the mechanical system in the apparatus are not excited. Since no disturbance vibration is transmitted to the laser measurement system or the focus detection system, rapid and precise positioning can be realized.

<Third Embodiment>

Figure 9:
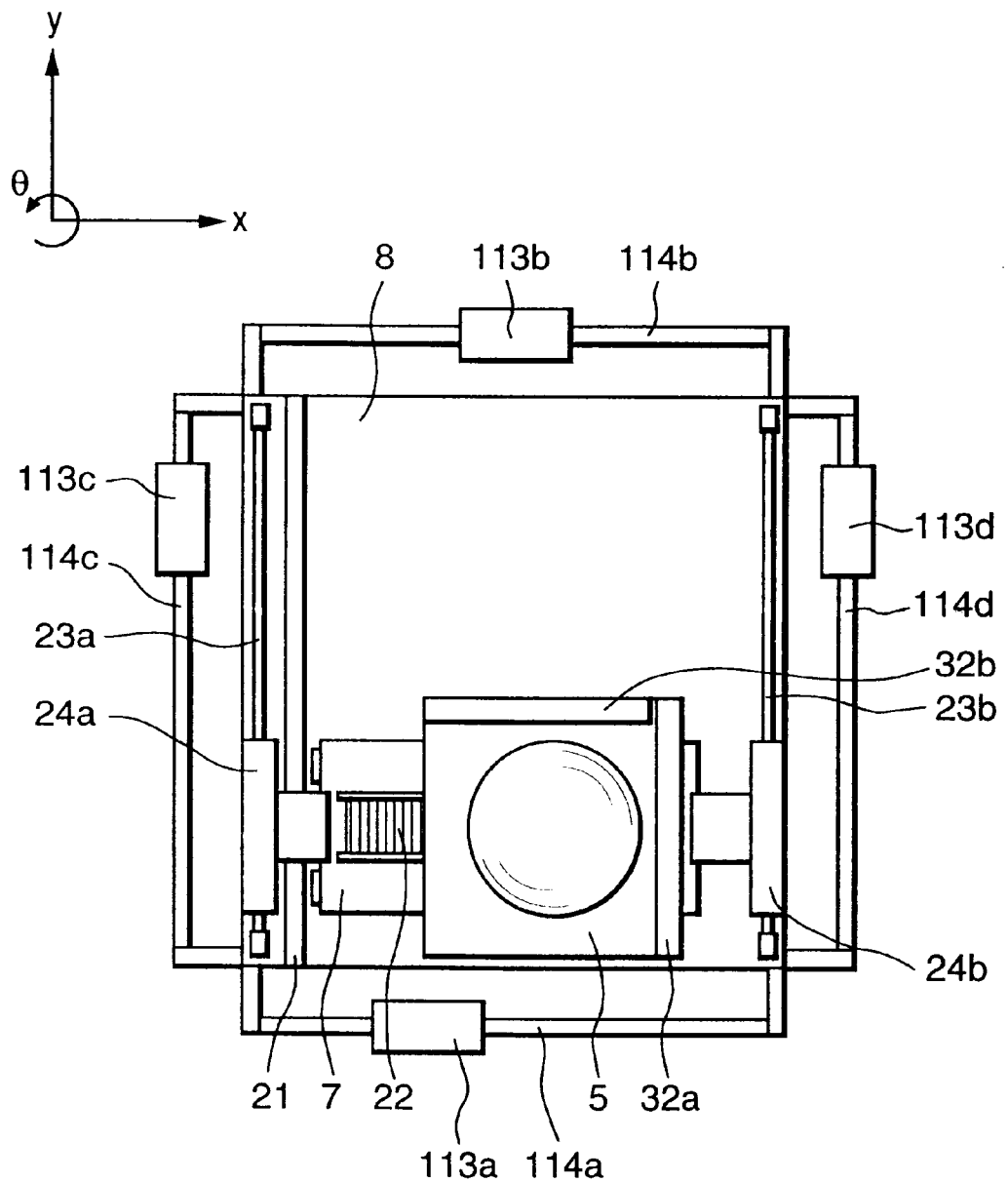
FIG. 9 is a plan view of a wafer mounting stage portion according to the third embodiment.

FIG. 9 is a plan view of a stage portion according to the third embodiment of the present invention. The same reference numerals as in the first embodiment shown in FIGS. 1 to 7 denote the same members in FIG. 9. Referring to FIG. 9, reference numerals 113a, 113b, 113c, and 113d denote mass bodies for applying inertial forces to a stage base 8; and 114a, 114b, 114c, and 114d, guides supporting the mass bodies 113a to 113d and fixed to the stage base 8 to guide the mass bodies 113a to 113d.

In the above arrangement, to cancel a driving reaction force generated upon driving the X-Y stage in the X direction, the mass bodies 113a and 113b are driven. When the X-Y stage is driven in the Y direction, the mass bodies 113c and 113d are driven. With this operation, the same effect as in the second embodiment can be obtained.

The third embodiment is characterized in that the mass of the entire apparatus can be reduced by making the moving strokes of the mass bodies 113a to 113d long without increasing the size of the entire apparatus, and making the masses of the mass bodies 113a to 113d small.

According to the third embodiment, the exciting force due to the moving acceleration of an X-Y stage 6 is canceled by inertial force application means 113, so the characteristic vibrations of the entire apparatus and various portions of the mechanical system incorporated in the apparatus are not excited. Therefore, precise positioning of the stage with respect to the exposure optical system or the like can be performed at a high speed.

When the X-Y stage 6 moves, the distribution of supporting forces of the plurality of air mounts changes due to the weight of the stage itself. The mass bodies serving as an inertial force application means according to the present invention cancels movement of the center of gravity of the stage. For this reason, the balance of supporting forces of the air mounts supporting the lens-barrel holder and the platform (apparatus main body structure) does not change. Therefore, highly precise positioning can be performed without changing the posture of the platform or lens-barrel holder and deforming the structure.

Since deformation of the apparatus main body (the lens-barrel holder and the platform) according to movement of the stage can be suppressed, an increase in cost due to an increase in rigidity and size of the apparatus main body can be suppressed even when the wafer stage becomes large along with an increase in wafer size.

<Fourth Embodiment>

In the fourth embodiment, the mechanism for applying an inertial force in the X-direction is made movable in the Y direction together with the stage to cause the reaction force to effectively act, thereby reducing vibration in moving the stage.

Figure 10:
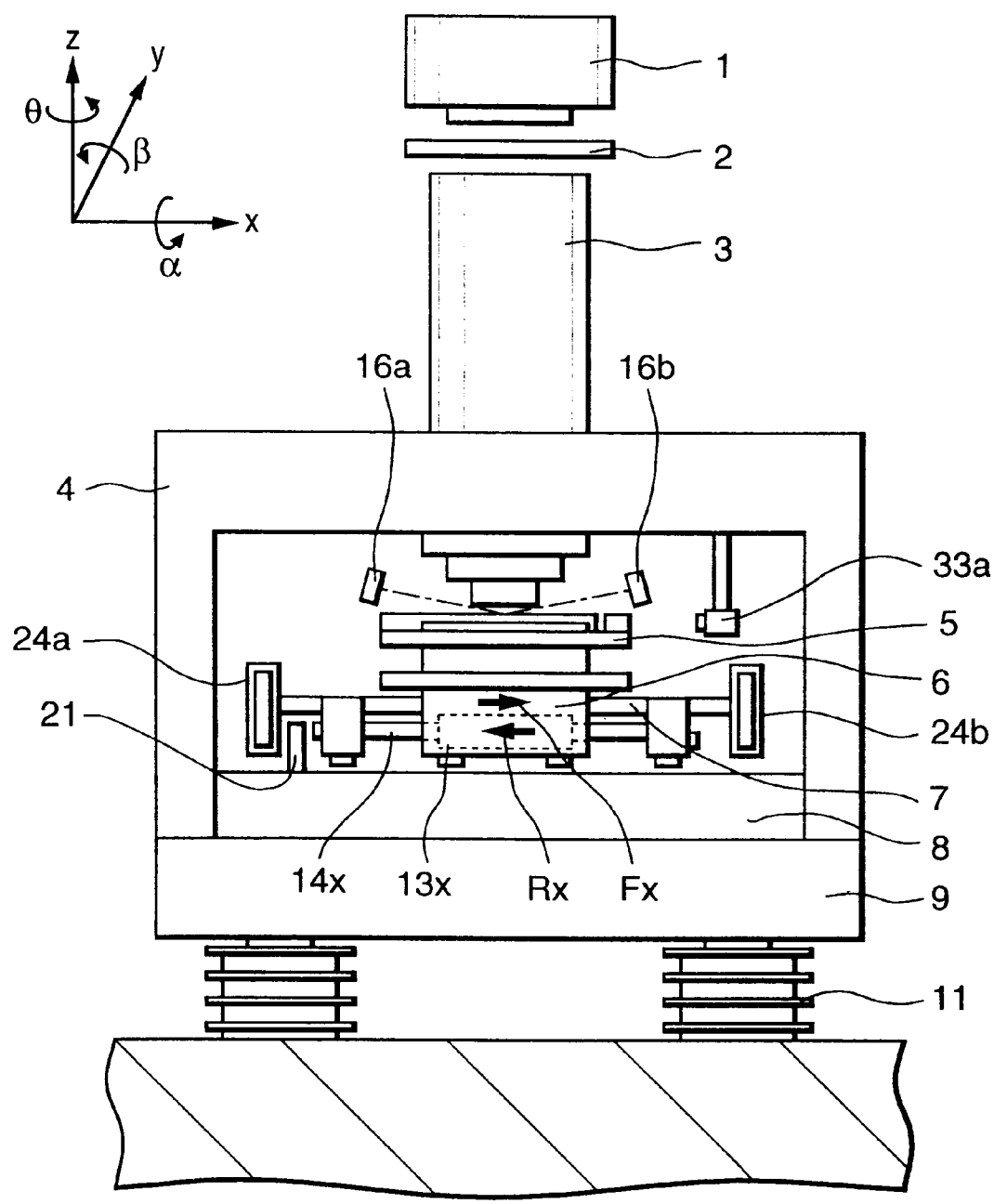
FIG. 10 is a front view showing a projecting exposure apparatus according to the fourth embodiment.
Figure 11:
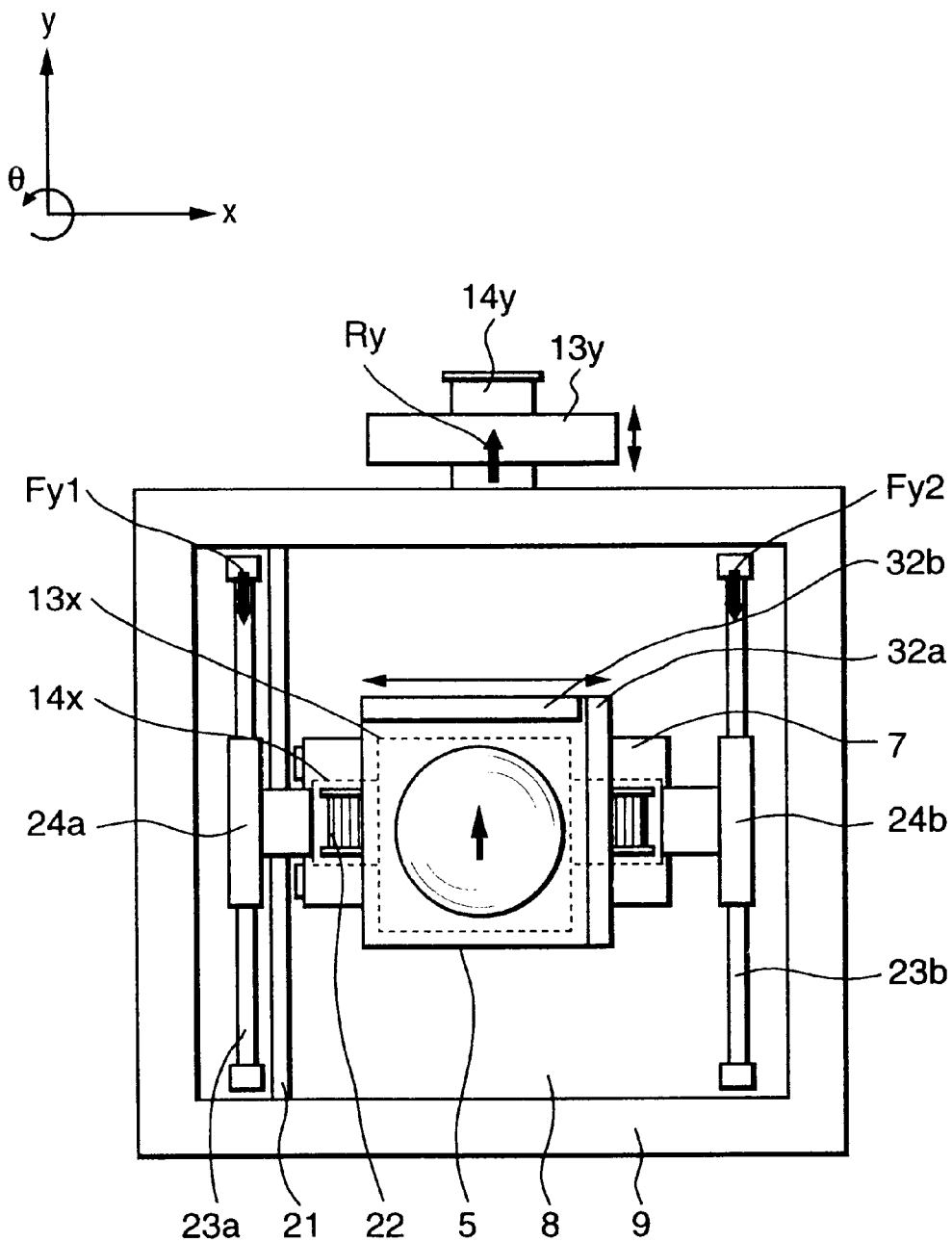
FIG. 11 is a plan view showing the wafer mounting stage portion of the projecting exposure apparatus shown in FIG. 10.

FIG. 10 is a front view showing the schematic arrangement of a projecting exposure apparatus according to the fourth embodiment. FIG. 11 is a plan view of a stage portion shown in FIG. 10. The same reference numerals as in FIGS. 1 and 2 denote the same members in FIGS. 10 and 11.

Reference numerals 13x and 13y denote mass bodies for applying an inertial force to a platform 9; and 14x and 14y, guides for supporting and guiding the mass bodies 13x and 13y. The guide 14x is fixed to a movable guide 7, and the guide 14y is fixed to the platform 9. Since the platform 9 is integrated with a stage base 8, the guide 14y may be attached to the stage base 8. Since the guide 14x is fixed to the movable guide 7, an X-direction inertial force application mechanism constituted by the mass body 13x, the guide 14x, and the like can be moved in the Y direction together with a top stage 5 and an X-Y stage 6. The axis of action of a force generated in driving the mass body 13x is positioned to almost match the axis of action of a force generated upon driving the top stage 5 and the X-Y stage 6 in the X direction when viewed from a direction perpendicular to the base reference surface. In addition, the axis of action of a force generated in driving the mass body 13y is positioned to almost match the axis of action of a force generated upon driving the top stage 5, the X-Y stage 6, the movable guide 7, and the X-direction inertial force application mechanism in the Y direction when viewed from the direction perpendicular to the base reference surface. In both cases, preferably, the axes of action almost match even when viewed from a direction parallel to the base reference surface.

The structure of the inertial force application mechanism constituted by the mass bodies 13x and 13y and the guides 14x and 14y is the same as that described in the first embodiment (FIG. 3). The laser measurement system and the control system are also the same as those described in the first embodiment (FIGS. 4 and 5). A mass body driver 155 drives the mass bodies 13x and 13y shown in FIG. 11.

In the above arrangement, first, a wafer (not shown) to be exposed is mounted on the top stage 5. An external controller (not shown) supplies a driving signal to the X-Y stage 6 and the top stage 5 to drive the wafer to a predetermined position and posture under a projecting lens 3. At this time, deviations from the target position of the wafer in the X, Y, and Z directions and in the rotational directions (α, β, and θ directions) are calculated by the external controller on the basis of the outputs from the laser measurement system and fed back to the corresponding driving units, so that the wafer is positioned/controlled to a predetermined position and posture. After the exposure, the wafer is moved to the next predetermined position and exposed, and this operation is repeated. The X-Y stage 6 is moved when an instruction signal is supplied from a controller 153 to a linear motor driver 156 in accordance with a predetermined velocity curve, and the linear motor generates a driving force corresponding to the instruction signal. The magnitude of the driving force equals an inertial force defined by the mass and predetermined acceleration/deceleration of the X-Y stage 6. The driving reaction force acts on the stage base 8 and is transmitted to the platform 9. At this time, an instruction signal is supplied from the controller 153 to the mass body driver 155 to cancel the driving reaction force, so the mass bodies 13x and 13y are driven to minimize the displacement of the platform 9.

For example, the driving signal is obtained in the following manner. In FIG. 10, assume driving in the X direction.

Let Fx be the reaction force in driving the X-Y stage 6 and the top stage 5, and Rx be the reaction force generated upon driving the mass body 13x. The reaction force Rx is given by equation (5) below on the basis of the balance of force:

$$Rx = -Fx \quad (5)$$

Since the mass body 13x moves in the Y direction together with the movable guide 7, the axes of action of the reaction forces Fx and Rx almost match when viewed from the direction perpendicular to the base reference surface. For this reason, the rotational torque due to the resultant force of the reaction forces Fx and Rx is not generated. Let mx be the mass of the mass body 13x, and Mx be the X-direction moving body mass of the top stage 5 and the X-Y stage 6. A necessary driving stroke sx of the mass body 13x is determined by the mass ratio of Mx to mx with respect to an X-direction stroke Sx of the X-Y stage and given by inequality (6):

$$sx \leq (Mx/mx) \cdot Sx \quad (6)$$

At this time, when mass mx is increased to lower the mass ratio Mx/mx and decrease the driving stroke sx, the energy necessary for driving the mass body 13x can be reduced. In this case, however, since the Y-direction moving mass including the mass body 13x increases, the energy necessary for movement in the Y direction becomes large. Therefore, the mass ratio of Mx to mx must be optimized in accordance with the stage driving pattern. For example, when Y-direction movement is more frequent than X-direction movement, the total driving energy can be reduced by increasing the mass mx to reduce the Y-direction moving mass. Conversely, when Y-direction movement is less frequent than the X-direction movement, the total driving energy can be made small by increasing the mass mx to reduce the mass ratio Mx/mx.

As shown in FIG. 11, for Y-direction driving as well, let $Fy_1$ and $Fy_2$ be driving reaction forces, and Ry be the reaction force generated by driving the mass body 13y. The reaction force is given by equation (7):

$$Ry = -(Fy_1 + Fy_2) \quad (7)$$

The ratio of $Fy_1$ to $Fy_2$ is normally determined such that the axis of action of the resultant force of $Fy_1$ and $Fy_2$ passes the center of gravity of the Y-direction moving mass. When the mass body 13x is appropriately driven, the center of gravity of the Y-direction moving mass is kept almost unchanged. For this reason, the ratio of $Fy_1$ to $Fy_2$ can also be kept unchanged. At this time, when the mass body 13y is arranged such that the axis of action of the reaction force Ry generated by driving the mass body 13y matches the axis of action of the resultant force of $Fy_1$ and $Fy_2$, the rotational torque due to the resultant force of $Fy_1$ and $Fy_2$ is not generated.

Let my be the mass of the mass body 13y, and My be the moving body mass of the top stage 5, the X-Y stage 6, and the movable guide 7 in the Y direction. A driving stroke sy of the mass body 13y is determined by the mass ratio with respect to a Y-direction stroke Sy of the X-Y stage. The necessary maximum stroke is given by inequality (8):

$$sy \leq (My/my) \cdot Sy \quad (8)$$

At this time, when the mass my is increased to lower the mass ratio My/my and decrease the driving stroke sy, the energy necessary for driving the mass body 13y can be made small.

As described above, large driving reaction forces in the X, Y, and θ directions, which act on the platform 9 in acceleration/deceleration, are canceled by driving the mass bodies 13x and 13y in the opposite directions to generate driving reaction forces in the reverse directions, so a lens-barrel holder 4 does not swing. In addition, when the mass bodies 13x and 13y are arranged on the axes of action of the X- and Y-direction driving reaction forces, respectively, generation of a rotational torque can be prevented. The moment reaction forces in the α and β directions are transmitted to the platform to swing the lens-barrel holder, although these reaction forces are much smaller than the forces in other directions.

Therefore, the characteristic vibrations of the entire apparatus supported by air mounts 11 and various portions of the mechanical system incorporated in the apparatus are not excited, and no disturbance vibration is transmitted to the wafer stage, the laser measurement system, or the focus detection system.

According to this embodiment, large reaction forces (X, Y, and θ directions) to be transmitted to the stage base 8 in correspondence with the inertial force generated upon accelerating/decelerating the X-Y stage 6 are canceled by driving the mass bodies 13x and 13y. With this arrangement, the characteristic vibrations of the entire apparatus supported by the air mounts 11 and various portions of the mechanical system incorporated in the apparatus are not excited. Since no disturbance vibration is transmitted to the wafer stage, the laser measurement system, or the focus detection system, rapid and precise positioning can be realized. Especially, since the inertial force application means for generating an inertial force in the X direction can be moved in the Y direction, vibration generated upon moving the stage can be reduced by causing the reaction force to directly act on the movable guide.

In addition, since the mass of the inertial force application means moves according to movement of the X-Y stage, the center of gravity of the entire positioning apparatus supported by the air mounts is kept unchanged, so the wafer overlay accuracy is improved.

<Fifth Embodiment>

Figure 12:
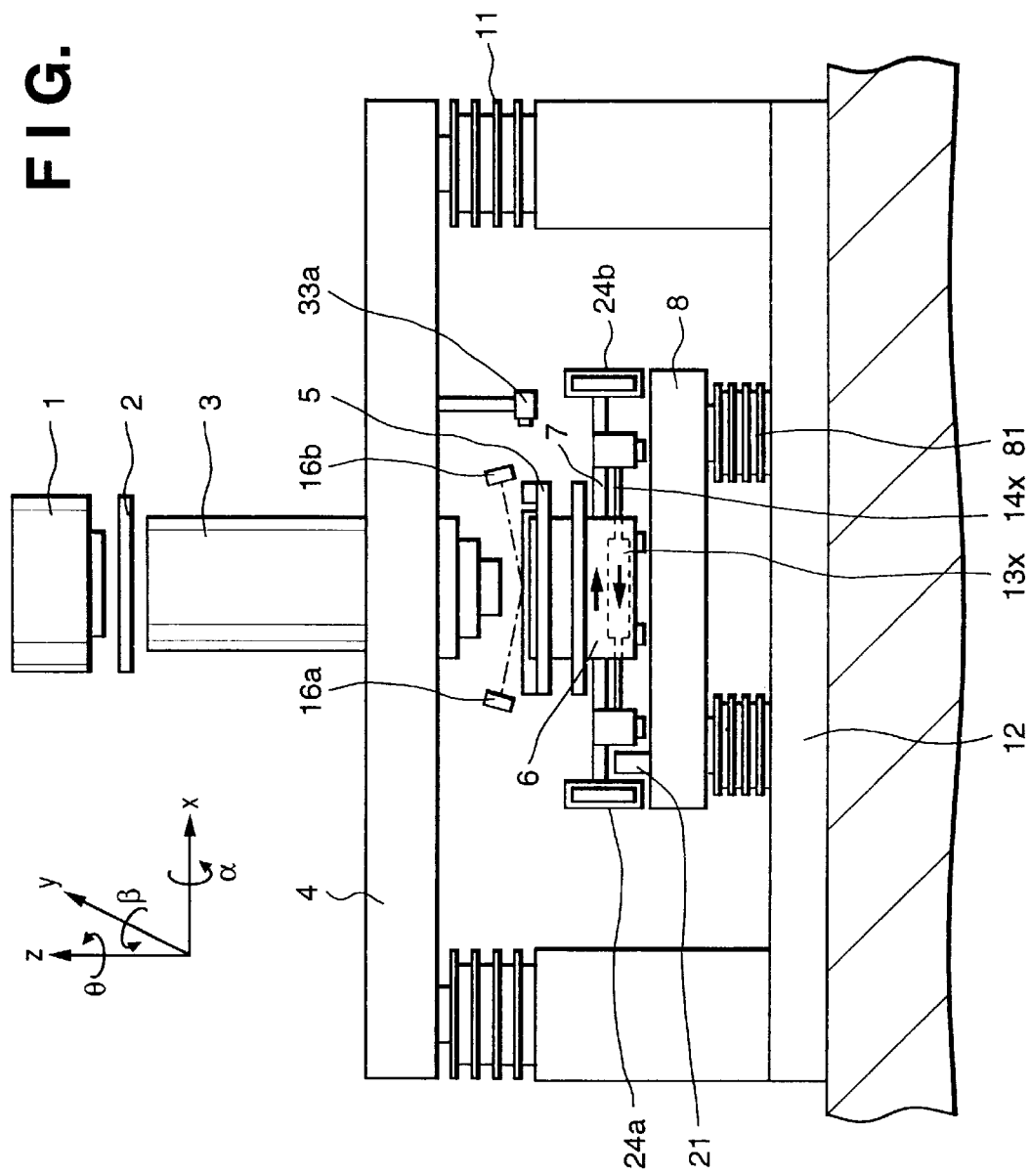
FIG. 12 is a front view showing a projecting exposure apparatus according to the fifth embodiment.
Figure 13:
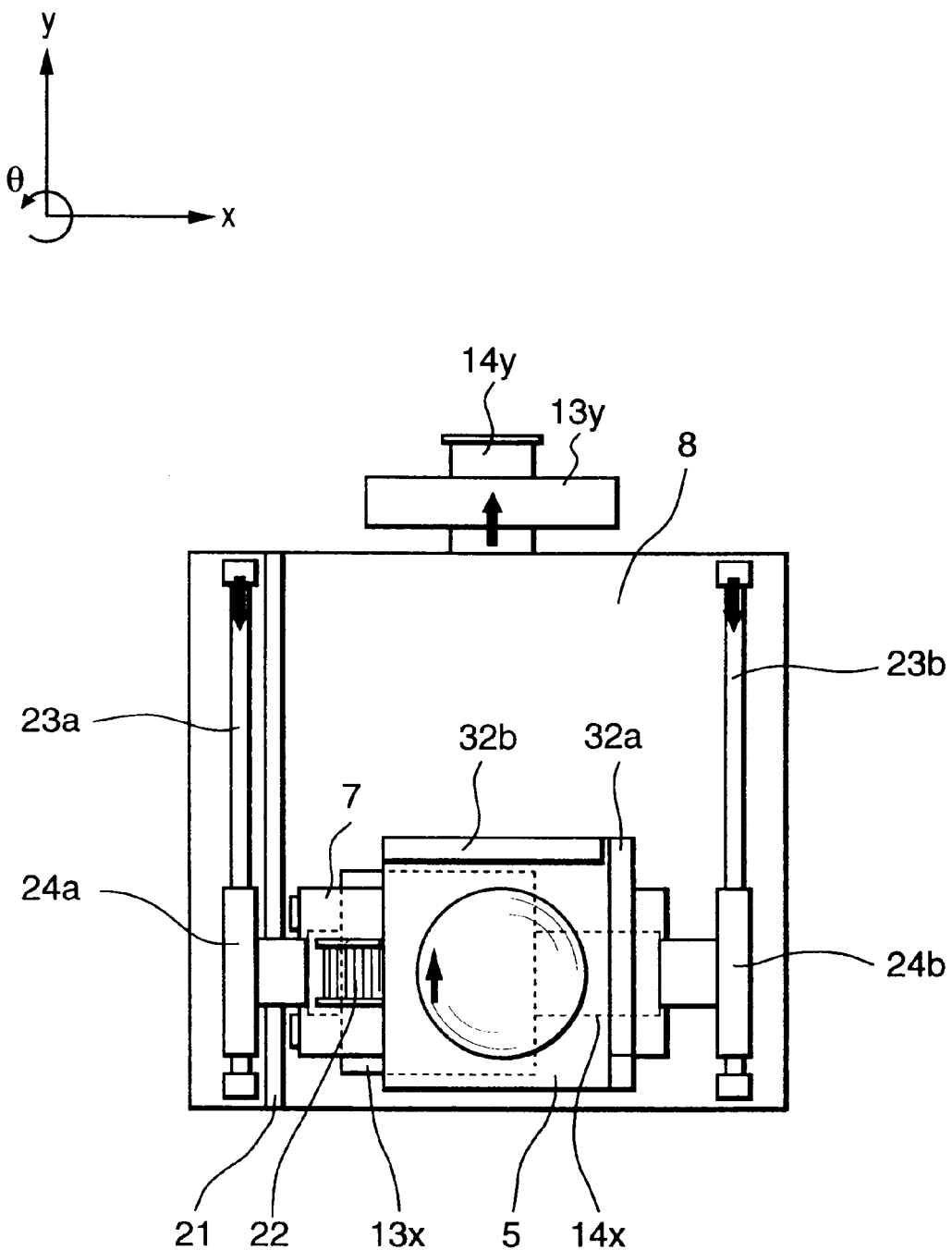
FIG. 13 is a plan view showing the wafer mounting stage portion of the projecting exposure apparatus shown in FIG. 12.

FIG. 12 is a front view of an exposure apparatus according to the fifth embodiment of the present invention. FIG. 13 is a plan view of a positioning stage apparatus shown in FIG. 12. The same reference numerals as in FIGS. 10 and 11 denote the same members in FIGS. 12 and 13.

Referring to FIG. 12, reference numeral 81 denotes an air mount (damper) arranged at each of three or more portions to support a stage base; and 12, a base supporting a lens-barrel holder 4 through air mounts 11 and also supporting a stage base 8 through the air mounts 81. Guides 14x and 14y constituting an inertial force application mechanism are fixed to a movable guide 7 and the stage base 8, respectively. Since the guide 14x is fixed to the movable guide 7, an X-direction inertial force application mechanism constituted by a mass body 13x, the guide 14x, and the like can move in the Y direction together with a top stage 5 and an X-Y stage 6. The axis of action of a force generated in driving the mass body 13x is positioned to almost match the axis of action of a force generated upon driving the top stage 5 and the X-Y stage 6 in the X direction when viewed from a direction perpendicular to the base reference surface. In addition, the axis of action of a force generated in driving a mass body 13y is positioned to almost match the axis of action of a force generated upon driving the top stage 5, the X-Y stage 6, the movable guide 7, and the X-direction inertial force application mechanism in the Y direction when viewed from the direction perpendicular to the base reference surface. In both cases, preferably, the axes of action almost match even when viewed from a direction parallel to the base reference surface.

In the exposure apparatus having the above arrangement, when the mass body 13 (13x or 13y) is driven in accordance with acceleration generated upon moving the X-Y stage 6 and the top stage 5 to a predetermined position to directly apply the inertial force to the stage base 8, the stage base 8 does not swing, as in the fourth embodiment. Therefore, the characteristic vibration of the wafer stage supported by the air mounts 81 is not excited. In addition, since the lens-barrel holder 4 is vibration-insulated from the wafer stage by the air mounts 81 and 11, the characteristic vibrations of the various portions of the mechanical system in the apparatus are not excited. For this reason, no disturbance vibration is transmitted to the laser measurement system or the focus detection system.

In this embodiment, in the exposure apparatus having a separate lens-barrel holder and wafer stage, large reaction forces (X, Y, and θ directions) to be transmitted to the stage base 8 in accordance with the inertial force generated upon accelerating/decelerating the X-Y stage 6 are canceled by driving the mass body 13 (13x or 13y) attached to the stage base 8. With this arrangement, the characteristic vibration of the wafer stage supported by the air mounts 81 is not excited. Since the lens-barrel holder 4 is vibration-insulated from the wafer stage by the air mounts 81 and 11, the characteristic vibrations of the various portions of the mechanical system in the apparatus are not excited. No disturbance vibration is transmitted to the laser measurement system or the focus detection system, so rapid and precise positioning can be realized.

Furthermore, since the mass of the inertial force application mechanism moves in accordance with movement of the X-Y stage, the center of gravity of the entire positioning apparatus supported by the air mounts is kept unchanged, so the wafer overlay accuracy is improved.

<Sixth Embodiment>

Figure 14:
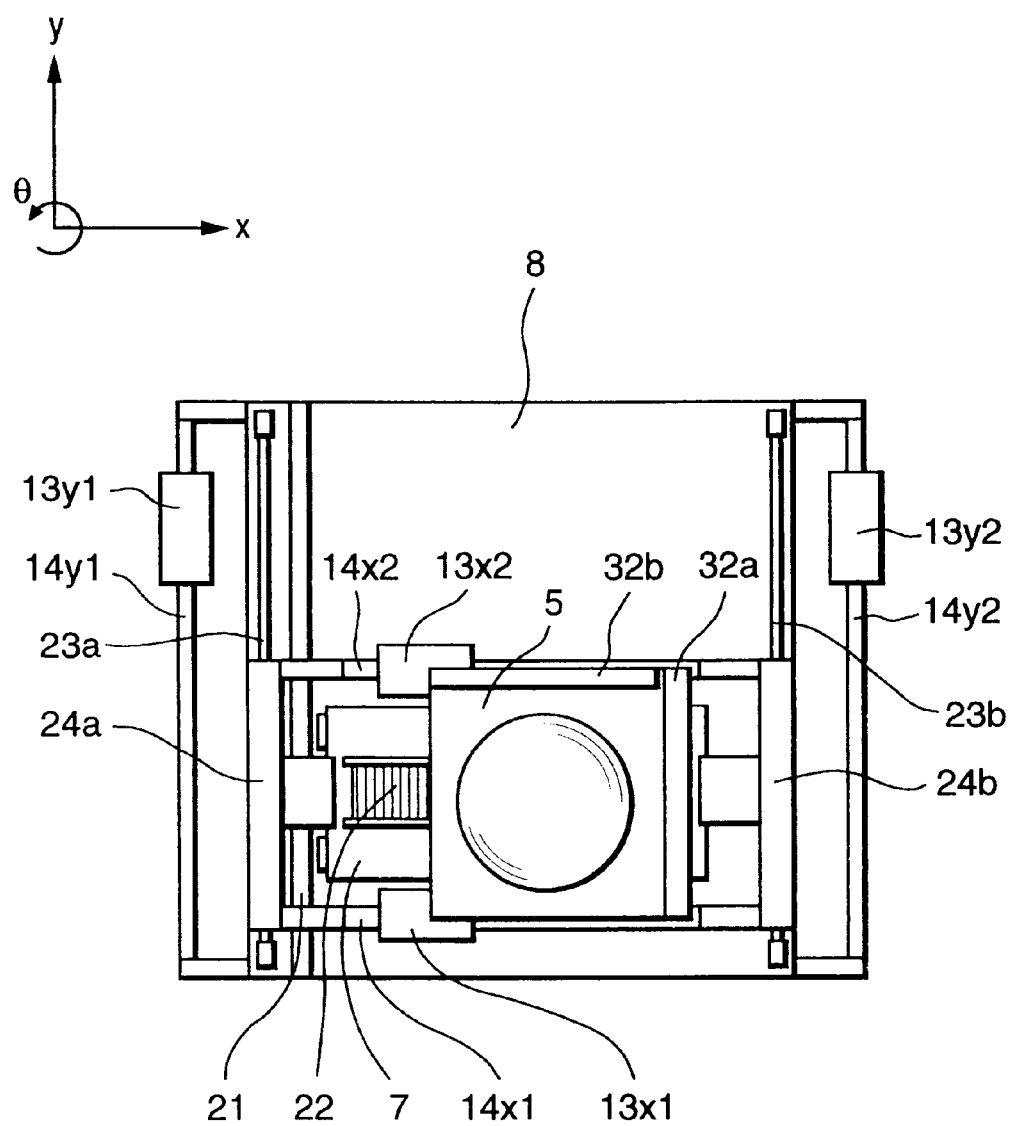
FIG. 14 is a plan view showing the wafer mounting stage portion of the projecting exposure apparatus according to the sixth embodiment.

FIG. 14 is a plan view of a positioning stage apparatus according to the sixth embodiment of the present invention. The same reference numerals as in the embodiment shown in FIGS. 10 and 11 denote the same members in FIG. 14.

Referring to FIG. 14, reference numerals $13x_1$, $13x_2$, $13y_1$, and $13y_2$ denote mass bodies for applying an inertial force to a stage base 8; and $14x_1$, $14x_2$, $14y_1$, and $14y_2$ denote guides for supporting and guiding the mass bodies $13x_1$, $13x_2$, $13y_1$, and $13y_2$, respectively. The guides $14x_1$ and $14x_2$ are fixed to a movable guide 7, and an X-direction inertial force application means constituted by the mass bodies $13x_1$ and $13x_2$ and the guides $14x_1$ and $14x_2$ can move in the Y direction together with a top stage 5 and an X-Y stage 6.

The axis of action of a driving force for moving the mass bodies $13x_1$ and $13x_2$ is positioned to almost match the axis of action of a driving force for moving the top stage 5 and the X-Y stage 6 in the X direction when viewed from a direction perpendicular to the base reference surface. In addition, the axis of action of a driving force for moving the mass bodies $13y_1$ and $13y_2$ is positioned to almost match the axis of action of a driving force for driving the top stage 5, the X-Y stage 6, the movable guide 7, and the X-direction inertial force application mechanism in the Y direction when viewed from the direction perpendicular to the base reference surface. In both cases, preferably, the axes of action almost match even when viewed from a direction parallel to the base reference surface.

In the above arrangement, to cancel the driving reaction force generated upon driving the X-Y stage in the X direction, the mass bodies $13x_1$ and $13x_2$ are driven and moved in a direction opposite to the X-Y stage along the X direction. On the other hand, when the X-Y stage is to be driven in the Y direction, the mass bodies $13y_1$ and $13y_2$ are driven and moved in a direction opposite to the X-Y stage.

According to this embodiment, the mass bodies $13x_1$ and $13x_2$ are arranged on both sides of the movable guide 7. With this arrangement, the axis of action of the force generated upon driving the mass bodies can be made to almost match the axis of action of the force generated upon driving the top stage 5 and the X-Y stage 6. In addition, the limitations on mass body arrangement can be minimized using a plurality of inertial force application means, thereby increasing the degree of freedom in design.

Furthermore, since the mass of the inertial force application mechanism moves in accordance with movement of the X-Y stage, the center of gravity of the entire positioning apparatus supported by the air mounts is kept unchanged, so the wafer overlay accuracy is improved.

In addition, when the mass bodies $13y_1$ and $13y_2$ are arranged to be symmetrical, the load on a plurality of air mounts 81 can be distributed to prevent an excess load from acting on a specific air mount.

<Seventh Embodiment>

In the seventh embodiment, in addition to the above-described direct dynamic inertial force application mechanism for applying an inertial force in the X and Y directions, a rotary inertial force application mechanism for applying a rotary inertial force is arranged. The reaction force is more effectively caused to act to reduce vibration in moving the stage.

Figure 15:
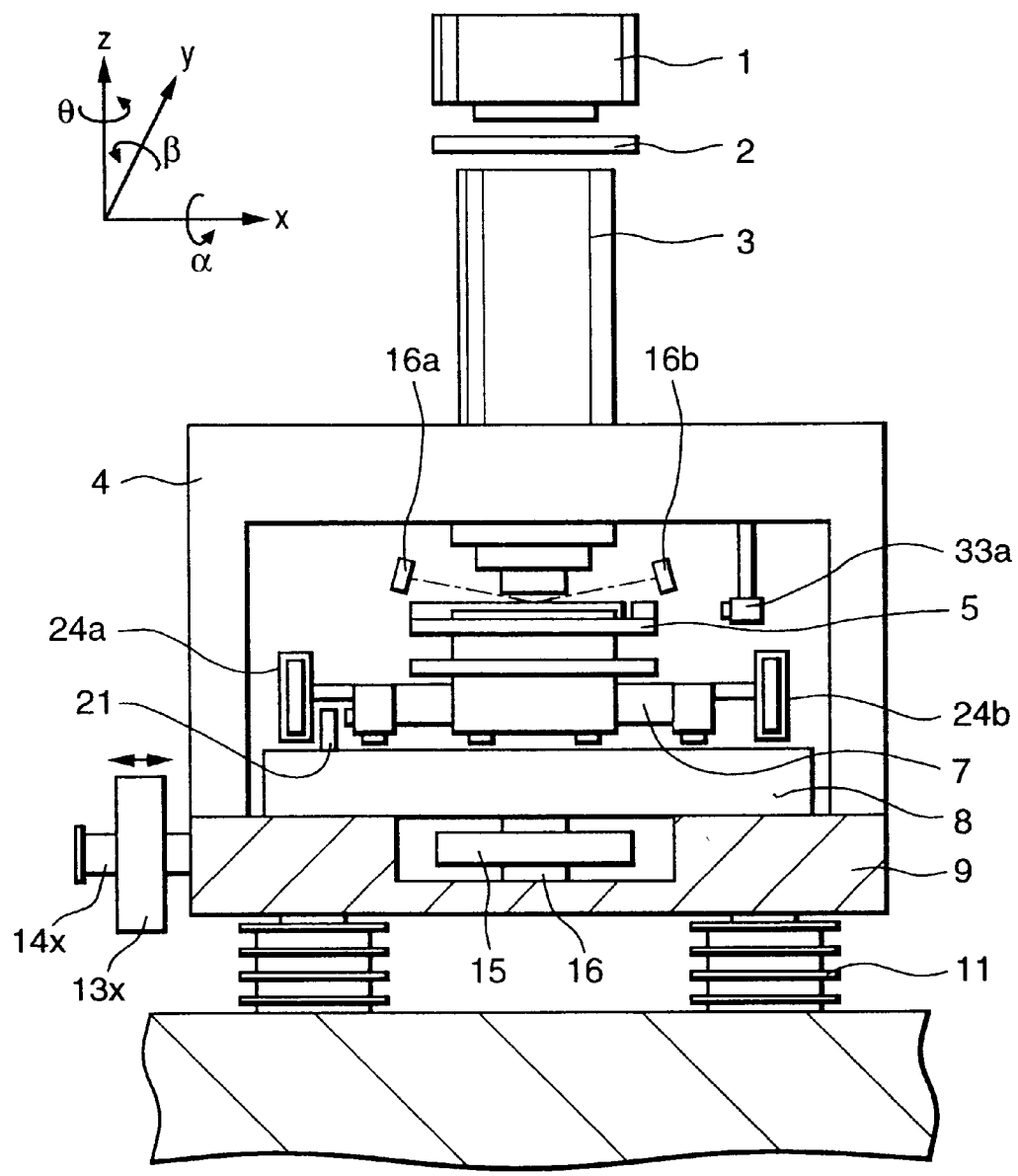
FIG. 15 is a front view showing a projecting exposure apparatus according to the seventh embodiment.
Figure 16:
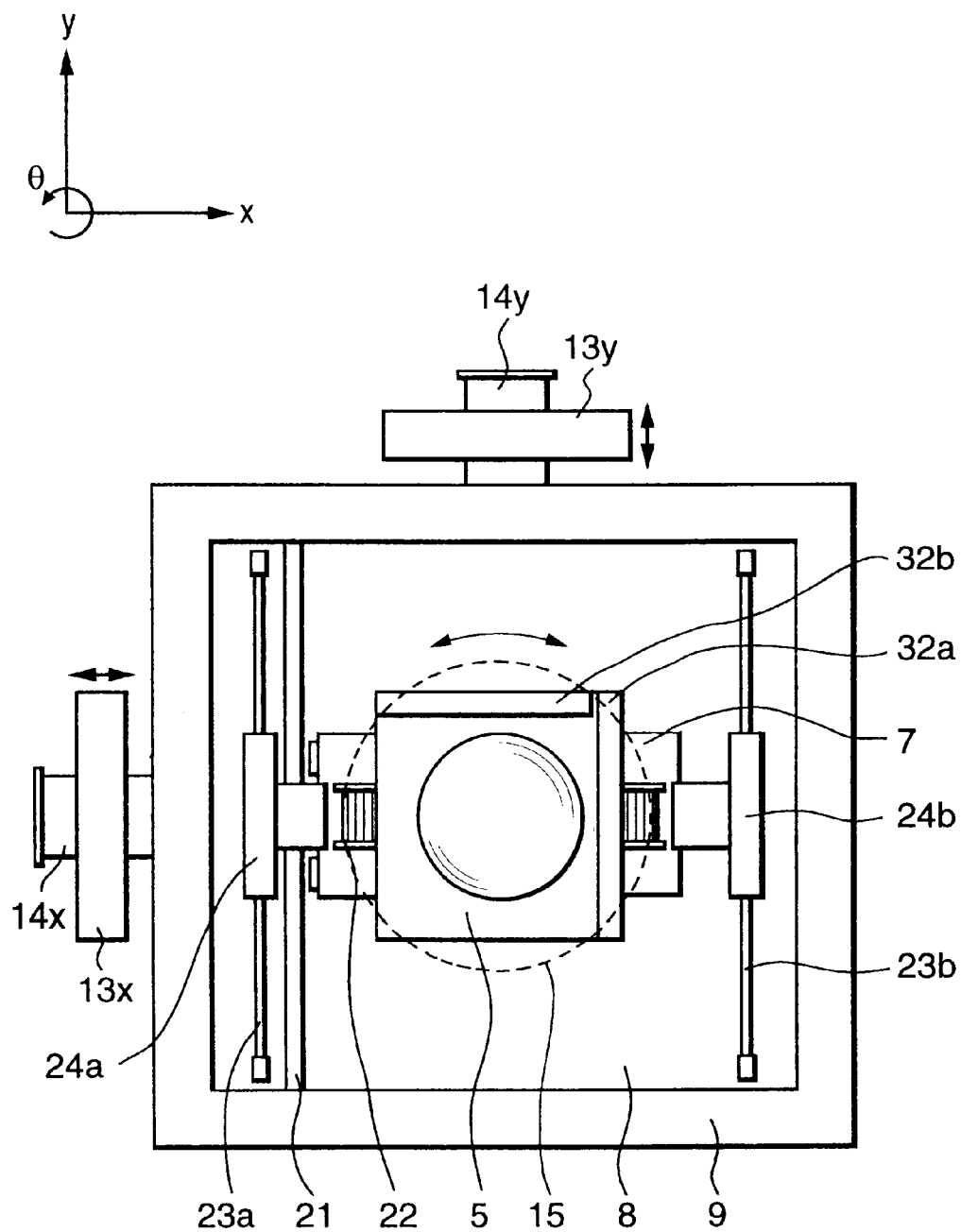
FIG. 16 is a plan view showing the wafer mounting stage portion of the projecting exposure apparatus shown in FIG. 15.

In FIGS. 15 and 16, mass bodies 13 (13x and 13y) apply an inertial force to a platform 9. Guides 14 (14x and 14y) fixed to the platform 9 support and guide the mass bodies 13.

A rotary mass body 15 applies a rotary inertial force to the platform 9. A guide 16 fixed to the platform 9 supports and guides the rotary mass body 15. A motor (not shown) for driving the rotary mass body 15 preferably generates not a translating force but only a rotational torque. For this purpose, the motor for driving the rotary mass body 15 preferably generates a torque in a non-contact state using, e.g., an electromagnetic force.

The inertial force application mechanism constituted by the mass bodies 13x and 13y and the guides 14x and 14y has the same structure as that described in the first embodiment (FIG. 3). The laser measurement system and the control system are also the same as those described in the first embodiment (FIGS. 4 and 5). A method of driving the mass bodies 13x, 13y, and 15 by a mass body driver will be described later.

In the above arrangement, first, a wafer (not shown) to be exposed is mounted on a top stage 5. An external controller (not shown) supplies a driving signal to an X-Y stage 6 and the top stage 5 to drive the wafer to a predetermined position and posture under a projecting lens 3. At this time, deviations from the target position of the wafer in the X, Y, and Z directions and in the rotational directions (α, β, and θ directions) are calculated by the external controller on the basis of the outputs from the laser measurement system and fed back to the corresponding driving units, so that the wafer is positioned/controlled to a predetermined position and posture. After the exposure, the wafer is moved to the next predetermined position and exposed, and this operation is repeated. The X-Y stage 6 is moved when an instruction signal is supplied from a controller 153 to a linear motor driver 156 in accordance with a predetermined velocity curve, and the linear motor generates a driving force corresponding to the instruction signal. The magnitude of the driving force equals an inertial force defined by the mass and predetermined acceleration/deceleration of the X-Y stage 6. The driving reaction force acts on a stage base 8 and is transmitted to the platform 9. At this time, an instruction signal is supplied from the controller 153 to a mass body driver 155 to cancel the driving reaction force, so the mass bodies 13x, 13y, and 15 are driven to minimize the displacement of the platform 9.

Figure 17:
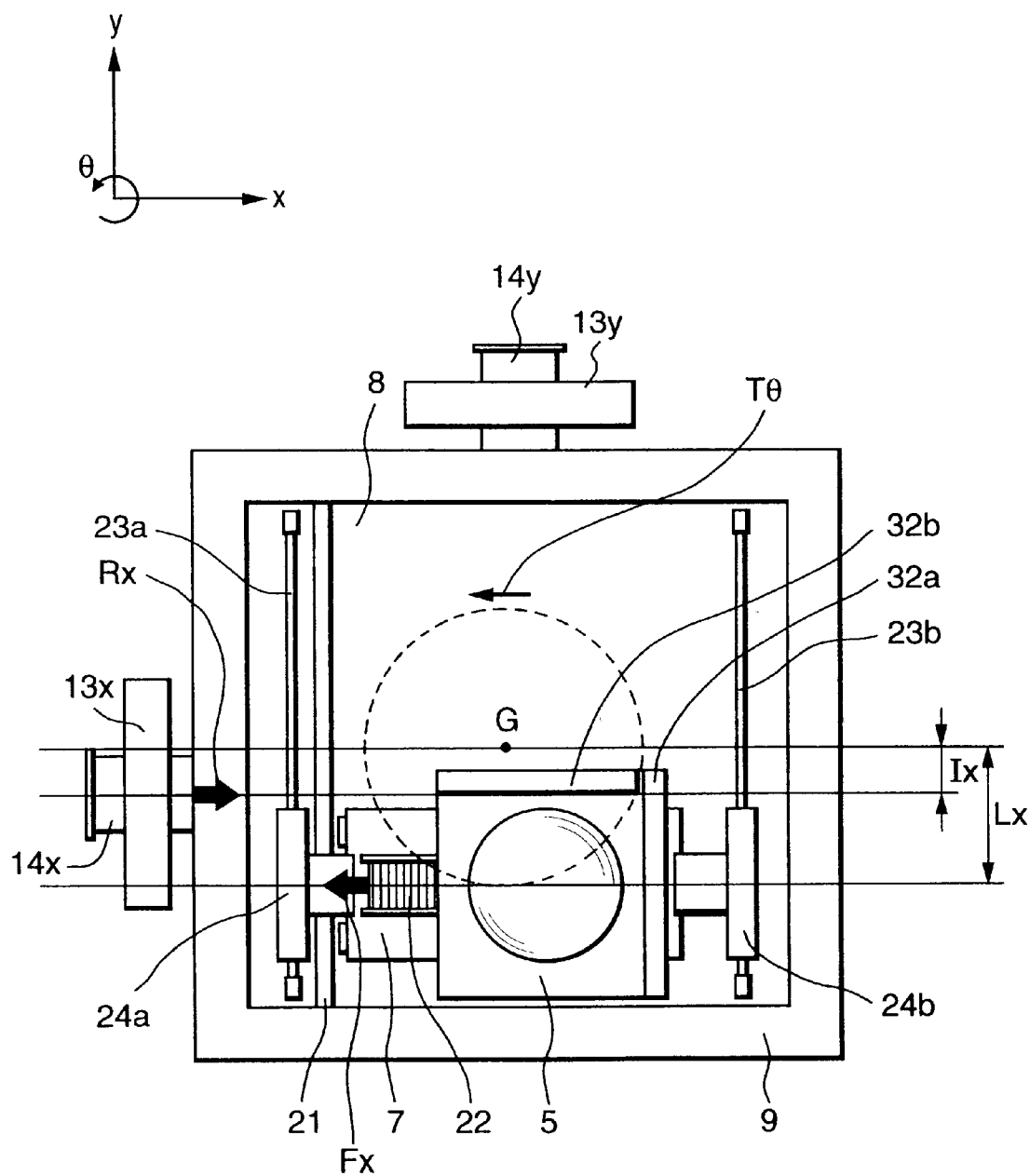
FIG. 17 is a plan view for explaining the X-direction action/reaction at the wafer mounting stage portion of the projecting exposure apparatus shown in FIG. 15.

For example, the driving signal (instruction signal for canceling the driving reaction force) is obtained in the following manner. In FIG. 17, assume driving in the X direction. Let Fx be the reaction force in driving the X-Y stage 6 and the top stage 5, and Rx be the reaction force generated upon driving the mass body 13x, and Tθ be the reaction torque generated upon rotating the mass body 15. Also, let G be the center of gravity of the entire structure including the platform 9 and members which are set on the platform 9 and receive the driving reaction force, Lx be the distance from the center of gravity G to the center of a linear motor stator 22 on the movable guide, and lx be the distance from the center of gravity G to the center of a linear motor stator 53 for driving the mass body 13x. The distances Lx and lx between the points of action of the respective forces can be obtained in advance. The reaction forces Rx and Tθ are given by equations (9) below on the basis of the balance of force and balance of moment:

$$Rx=-Fx \quad T\theta=-(Lx-lx)Fx \qquad (9)$$

Let mx be the mass of the mass body 13x, and Mx be the moving body mass of the top stage 5 and the X-Y stage 6 in the X direction. A necessary driving stroke sx of the mass body 13x is determined by the mass ratio to a stroke Sx of the X-Y stage 6 in the X direction. The necessary maximum stroke is represented by inequality (10):

$$sx \leq \frac{Mx}{mx} Sx \qquad (10)$$

Figure 18:
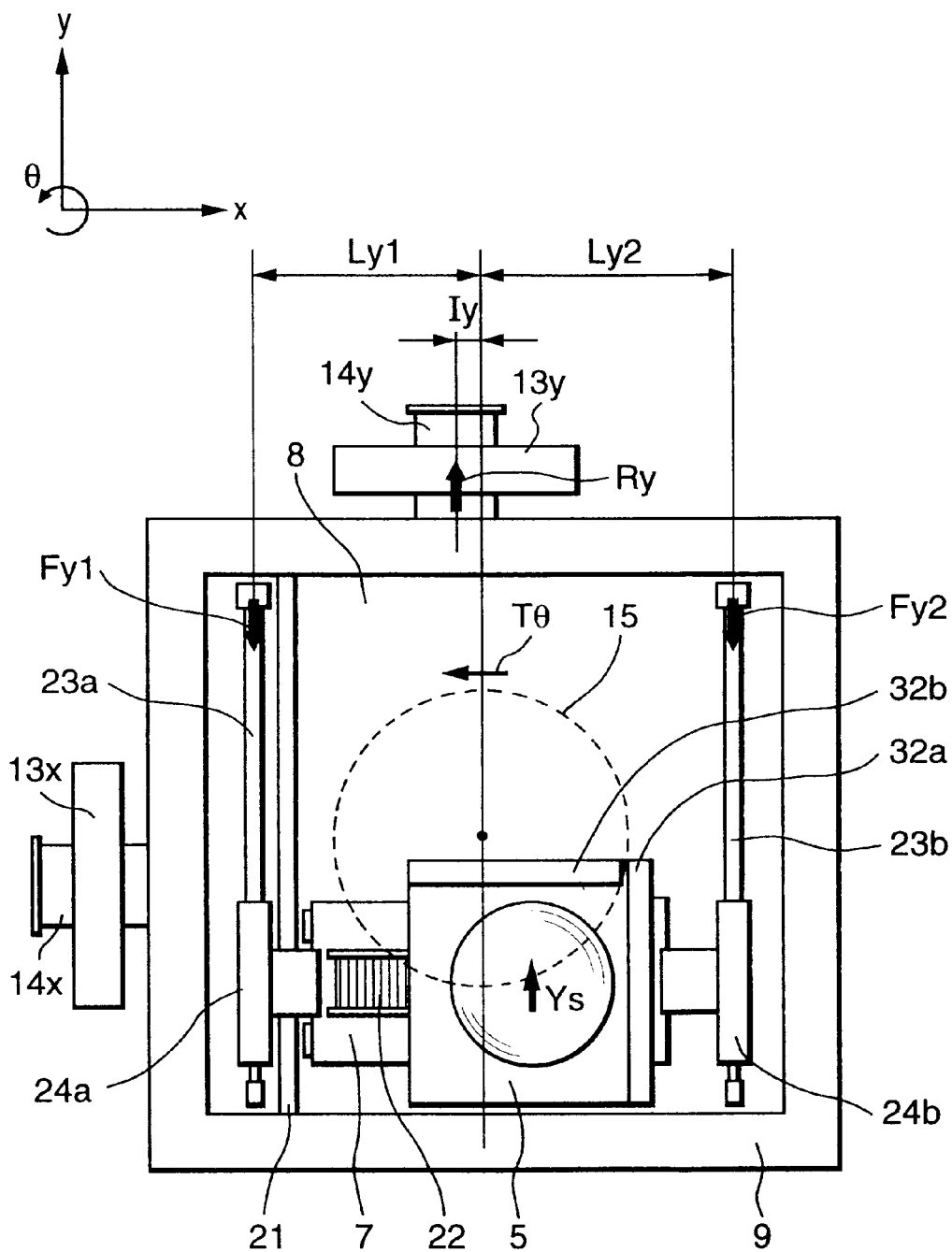
FIG. 18 is a plan view for explaining the Y-direction action/reaction at the wafer mounting stage portion of the projecting exposure apparatus shown in FIG. 15.

As shown in FIG. 18, in driving in the Y direction as well, let Fy1 and Fy2 be the driving reaction forces, Ry be the reaction force generated upon driving the mass body 13y, and Ly1, Ly2, and ly be the distances between the center of gravity G and the points of action of the respective forces. Letting Tθ be the reaction torque generated upon rotating the mass body 15, the reaction forces Ry and Tθ are given by equations (11):

$$Ry=-(Fy1+Fy2) \quad T\theta=-(Ly1-ly)Fy1-(Ly2-ly)Fy2 \qquad (11)$$

Let my be the mass of the mass body 13y, and My be the moving body mass of the top stage 5, the X-Y stage 6, and a movable guide 7 in the Y direction. A necessary driving stroke sy of the mass body 13y is determined by the mass ratio to a stroke Sy of the X-Y stage 6 in the Y direction. The necessary maximum stroke is represented by inequality (12):

$$sy \leq \frac{My}{my} Sy \qquad (12)$$

When the axes of action of the mass bodies 13x and 13y are present on the center of gravity G, lx and ly become zero, so calculation of the reaction torque Tθ is facilitated.

As described above, large driving reaction forces in the X, Y, and θ directions, which act on the platform 9 in acceleration/deceleration, are canceled by driving the mass bodies 13x, 13y, and 15 in the opposite directions to generate driving reaction forces in the reverse directions, so a lens-barrel holder 4 does not swing. The moment reaction forces in the α and β directions are transmitted to the platform to swing the lens-barrel holder 4, although these reaction forces are much smaller than the forces in other directions.

Therefore, the characteristic vibrations of the entire apparatus supported by air mounts 11 and various portions of the mechanical system incorporated in the apparatus are not excited, and no disturbance vibration is transmitted to the wafer stage, the laser measurement system, or the focus detection system.

According to this embodiment, large reaction forces (X, Y, and θ directions) to be transmitted to the stage base 8 in correspondence with the inertial force generated upon accelerating/decelerating the X-Y stage 6 are canceled by driving the mass bodies 13x, 13y, and 15 attached to the platform 9. With this arrangement, the characteristic vibrations of the entire apparatus supported by the air mounts 11 and various portions of the mechanical system incorporated in the apparatus are not excited. Since no disturbance vibration is transmitted to the wafer stage, the laser measurement system, or the focus detection system, rapid and precise positioning can be realized.

When the X-Y stage 6 moves, the distribution of supporting force of the plurality of air mounts 11 changes due to the weight of the stage itself, although the mass body of the inertial force application mechanism cancels movement of center of the gravity of the stage. Therefore, the support force balance of the air mounts 11 supporting the lens-barrel holder 4 and the platform 9 (apparatus main body structure) does not change. Therefore, highly precise positioning can be performed without changing the posture of the platform 9 or lens-barrel holder 4 and deforming the structure.

Since deformation of the apparatus main body (the lens-barrel holder and the platform) according to movement of the stage can be suppressed, an increase in cost due to an increase in rigidity and size of the apparatus main body can be suppressed even when the wafer stage becomes large along with an increase in wafer size.

<Eighth Embodiment>

Figure 19:
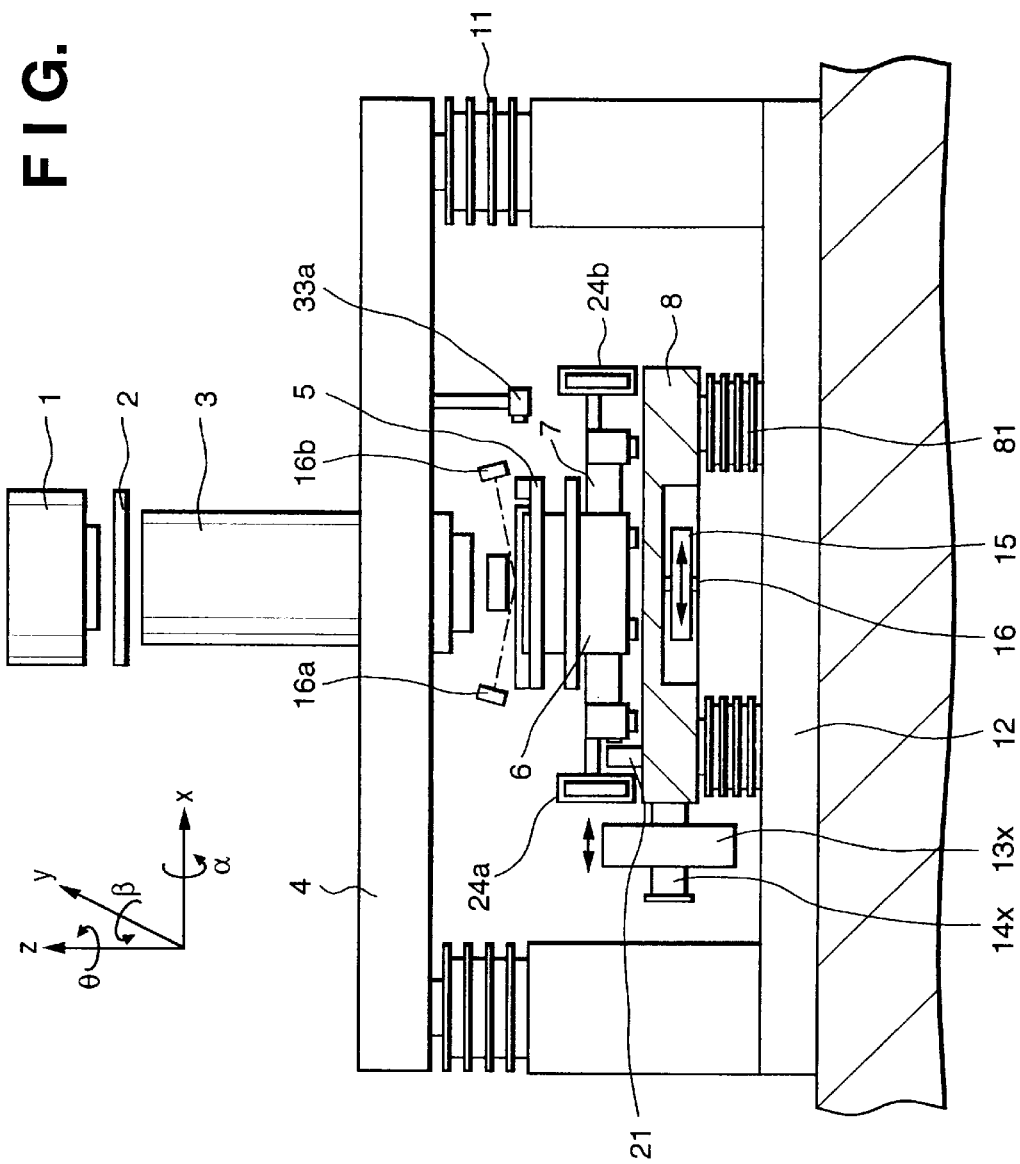
FIG. 19 is a front view showing a projecting exposure apparatus according to the eighth embodiment.

FIG. 19 is a front view of an exposure apparatus according to the eighth embodiment of the present invention. The same reference numerals as in the above-described embodiments denote the same members in FIG. 19. Referring to FIG. 19, reference numeral 81 denotes an air mount arranged at each of three or more portions to support a stage base 8; and 12, a base supporting a lens-barrel holder 4 through air mounts 11 and also supporting the stage base 8 through the air mounts 81. Guides 14x, 14y, and 16 constituting an inertial force application means are fixed to the stage base 8.

In the exposure apparatus having the above arrangement, mass bodies 13 (13x and 13y) are driven in correspondence with the acceleration/deceleration in moving an X-Y stage 6 and a top stage 5 to predetermined positions to directly apply an inertial force to the stage base 8, so the stage base 8 does not swing, as in the seventh embodiment. Therefore, the characteristic vibration of the wafer stage supported by the air mounts 81 is not excited. In addition, since the lens-barrel holder 4 is vibration-insulated from the wafer stage by the air mounts 81 and 11, the characteristic vibrations of the various portions of the mechanical system in the apparatus are not excited, so no disturbance vibration is transmitted to the laser measurement system or the focus detection system.

This embodiment has the following characteristic feature. In the exposure apparatus whose lens-barrel holder and wafer stage are formed as independent units, the mass bodies 13 (13x and 13y) and 15 attached to the stage base 8 are driven to cancel large reaction forces (X, Y, and θ directions) transmitted to the stage base 8 in correspondence with the inertial force generated upon accelerating/decelerating the X-Y stage 6, so that the characteristic vibration of the wafer stage supported by the air mounts 81 is not excited. In addition, the lens-barrel holder 4 is vibration-insulated from the wafer stage by the air mounts 81 and 11 such that the characteristic vibrations of various portions of the mechanical system in the apparatus are not excited. Since no disturbance vibration is transmitted to the laser measurement system or the focus detection system, rapid and precise positioning can be realized.

<Ninth Embodiment>

Figure 20:
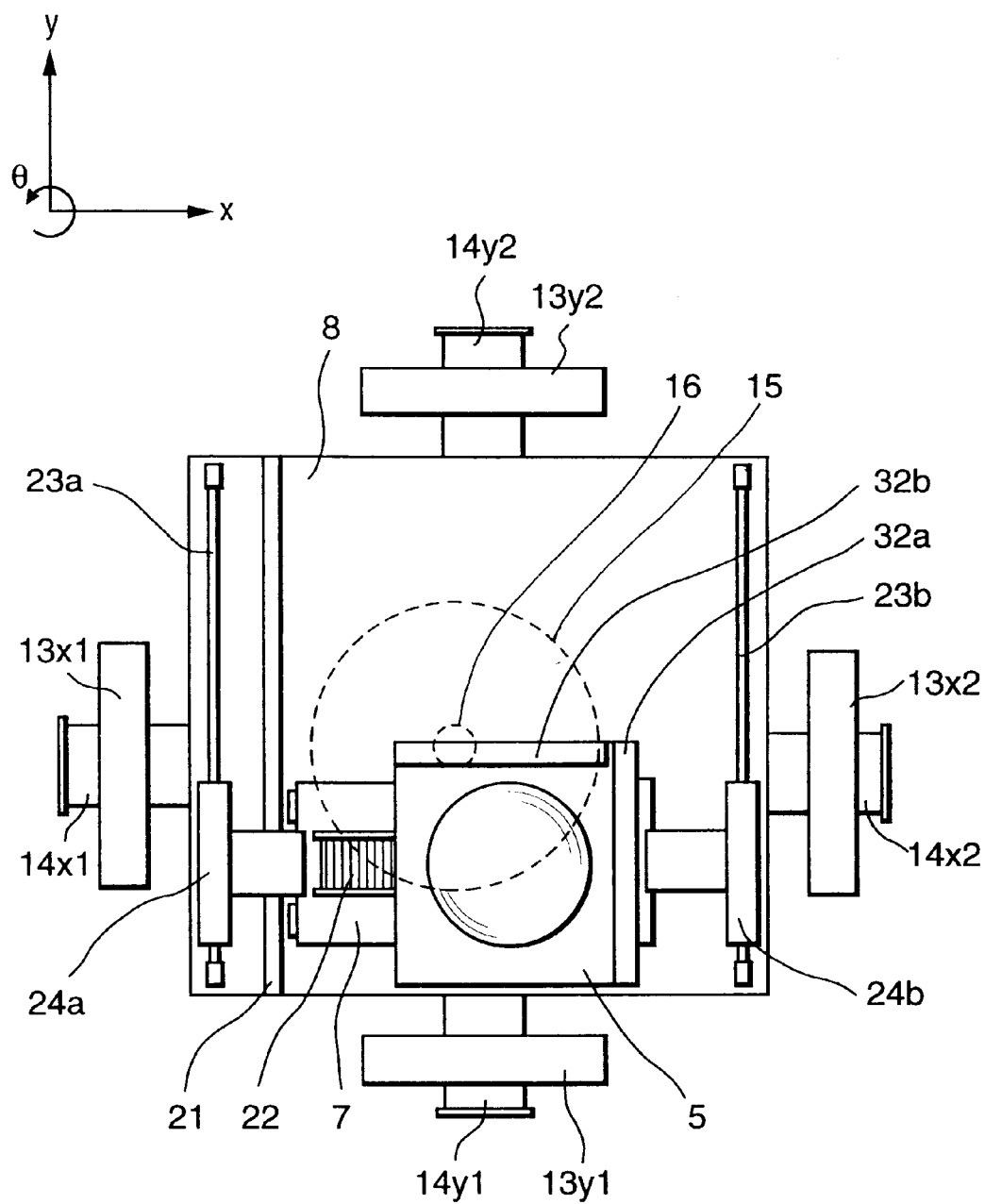
FIG. 20 is a plan view showing the wafer mounting stage portion of a projecting exposure apparatus according to the ninth embodiment.

FIG. 20 is a plan view of the stage portion of an exposure apparatus according to the ninth embodiment of the present invention. The same reference numerals as in the above-described embodiments denote the same members in FIG. 20. Referring to FIG. 20, reference numerals 13x1, 13x2, 13y1, 13y2, and 15 denote mass bodies for applying inertial forces to a stage base 8; and 14x1, 14x2, 14y1, 14y2, and 16, guides supporting the mass bodies 13x1, 13x2, 13y1, 13y2, and 15, respectively, and fixed to the stage base 8 to guide the mass bodies.

In the above arrangement, to cancel a driving reaction force generated upon driving the X-Y stage in the X direction, the mass bodies 13x1, 13x2, and 15 are driven. When the X-Y stage is driven in the Y direction, the mass bodies 13y1, 13y2, and 15 are driven. With this operation, the same effect as in the second embodiment can be obtained.

According to this embodiment, the mass bodies 13x1, 13x2, 13y1, 13y2, and 15 are arranged to be symmetrical. With this arrangement, the load on the air mounts 81 can be uniformly distributed to prevent an excess load from acting on a specific air mount.

<10th Embodiment>

Figure 21:
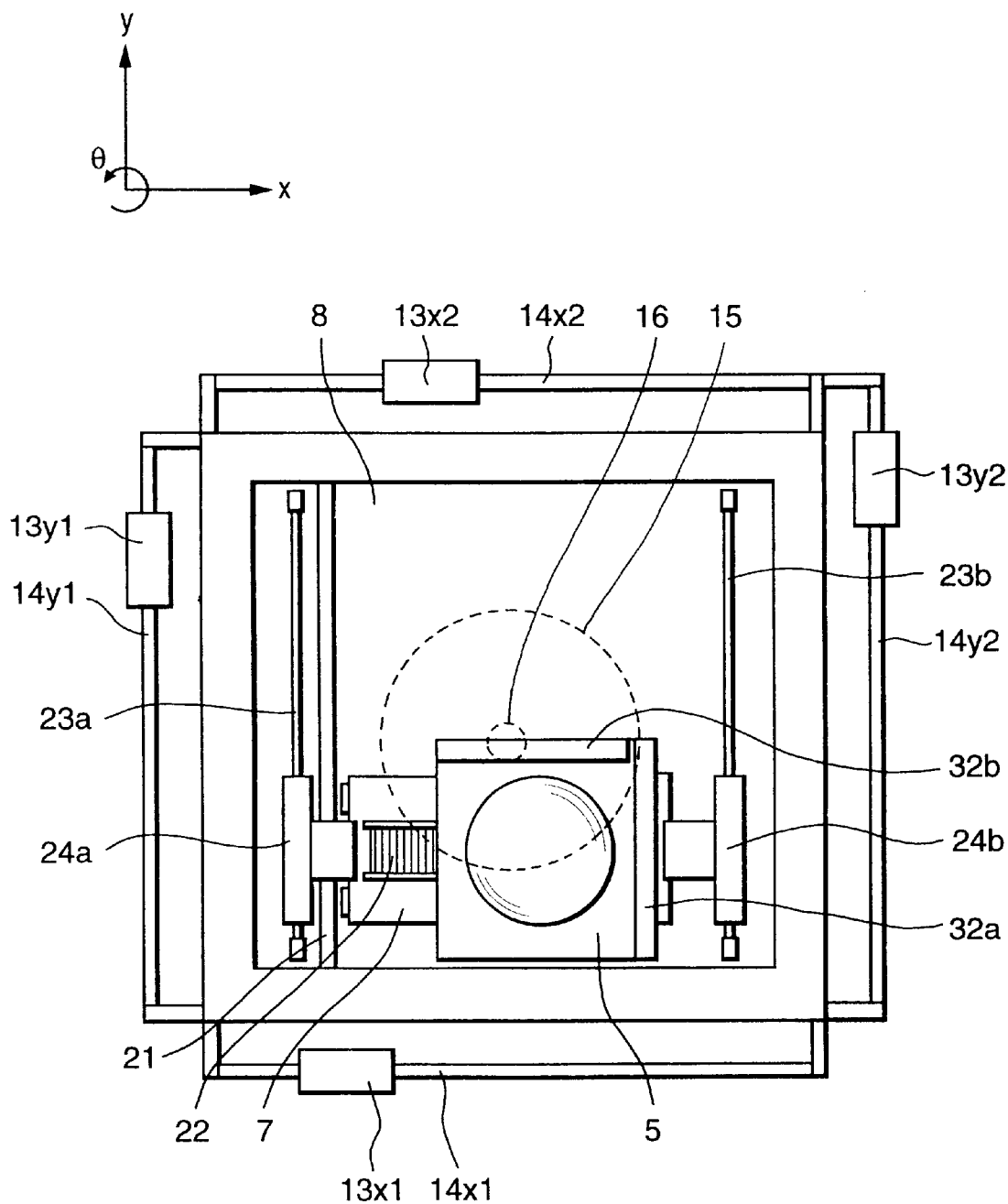
FIG. 21 is a plan view showing the wafer mounting stage portion of a projecting exposure apparatus according to the 10th embodiment.

FIG. 21 is a plan view of the stage portion of an exposure apparatus according to the 10th embodiment of the present invention. The same reference numerals as in the above-described embodiments denote the same members in FIG. 21. Referring to FIG. 21, reference numerals 13x1, 13x2, 13y1, 13y2, and 15 denote mass bodies for applying inertial forces to a stage base 8; and 14x1, 14x2, 14y1, 14y2, and 16, guides supporting the mass bodies 13x1, 13x2, 13y1, 13y2, and 15, respectively, and fixed to the stage base 8 to guide the mass bodies.

In the above arrangement, to cancel a driving reaction force generated upon driving the X-Y stage in the X direction, the mass bodies 13x1, 13x2, and 15 are driven. When the X-Y stage is driven in the Y direction, the mass bodies 13y1, 13y2, and 15 are driven. With this operation, the same effect as in the eighth embodiment can be obtained.

According to this embodiment, the moving strokes of the mass bodies 13x1, 13x2, 13y1, and 13y2 are made long without increasing the size of the entire apparatus, and the masses of the mass bodies 13x1, 13x2, 13y1, and 13y2 are made small. With this arrangement, the mass of the entire apparatus can be reduced.

<Embodiment of Device Producing Method>

An embodiment of a device producing method using the above-described exposure apparatus will be described below.

Figure 22:
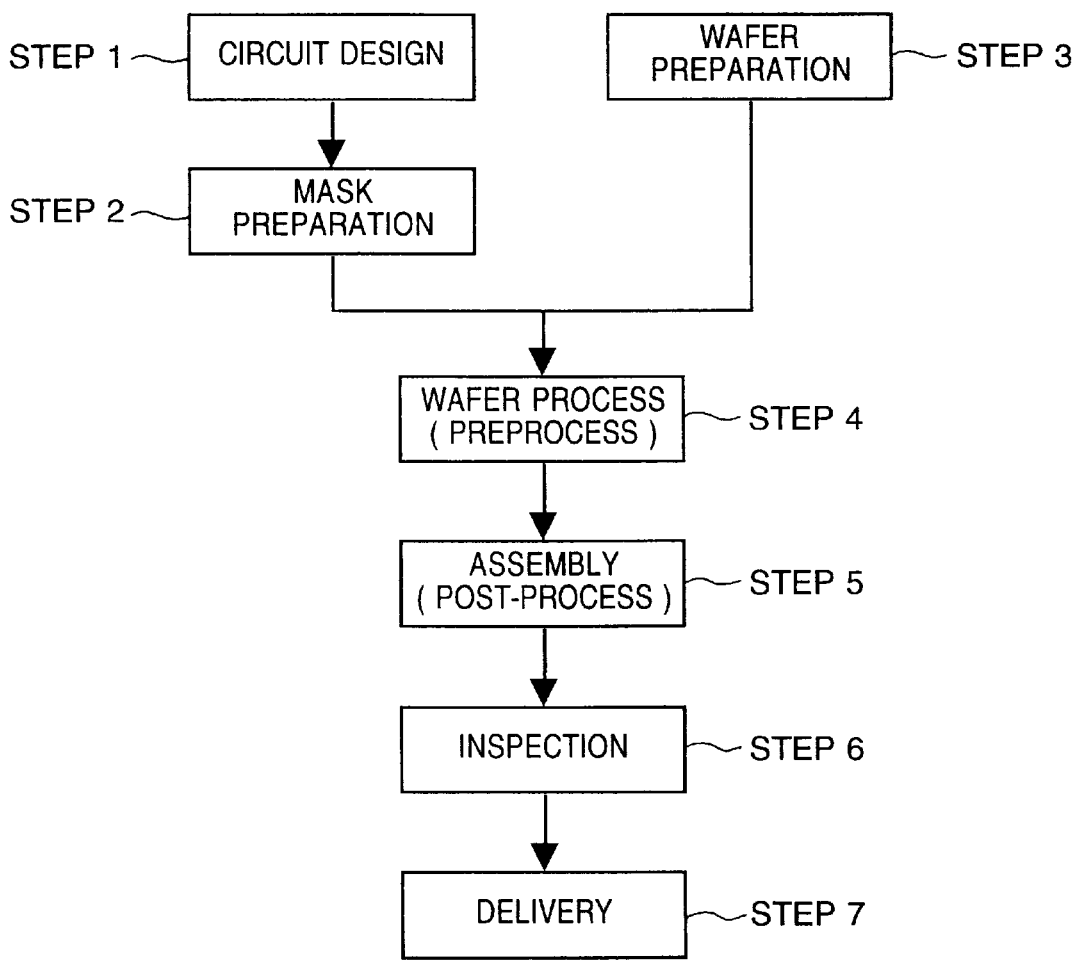
FIG. 22 is a flow chart for explaining the steps in manufacturing a device by applying the projecting exposure apparatuses of the first to 10th embodiments.

FIG. 22 shows the flow in manufacturing a microdevice (a semiconductor chip such as an IC or LSI, a liquid crystal panel, a CCD, a thin-film magnetic head, a micromachine, or the like). In step 1 (circuit design), the pattern of the device is designed. In step 2 (mask preparation), a mask with the designed pattern is prepared. In step 3 (wafer preparation), a wafer is manufactured using materials such as silicon or glass. In step 4 (wafer process) called a pre-process, an actual circuit is formed on the wafer by lithography using the prepared mask and wafer. In step 5 (assembly) called a post-process, a semiconductor chip is formed from the wafer manufactured in step 4. The post-process includes assembly (dicing and bonding) and packaging (chip encapsulation). In step 6 (inspection), the semiconductor device manufactured in step 5 is subjected to inspection such as an operation check test and a durability test. The semiconductor device completed by the above processes is delivered (step 7).

Figure 23:
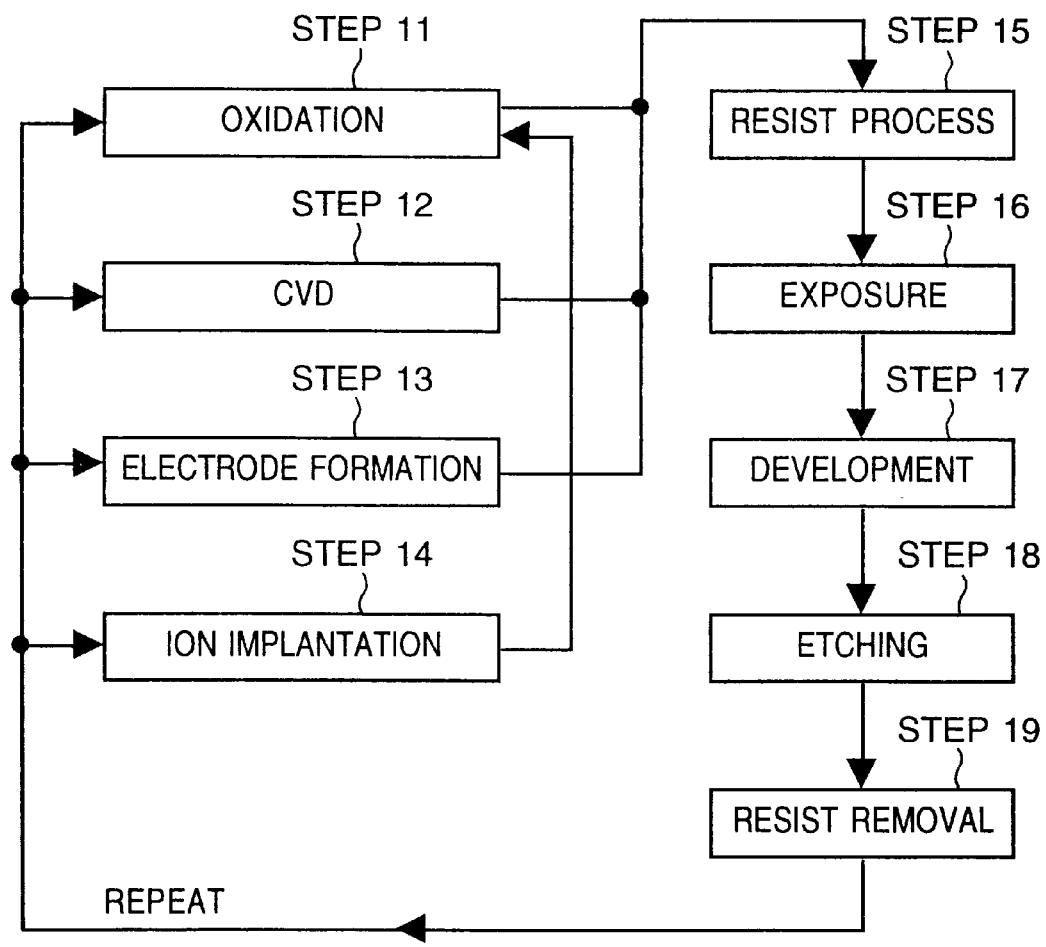
FIG. 23 is a flow chart for explaining the steps in manufacturing a device by applying the projecting exposure apparatuses of the first to 10th embodiments.
Figure 24:
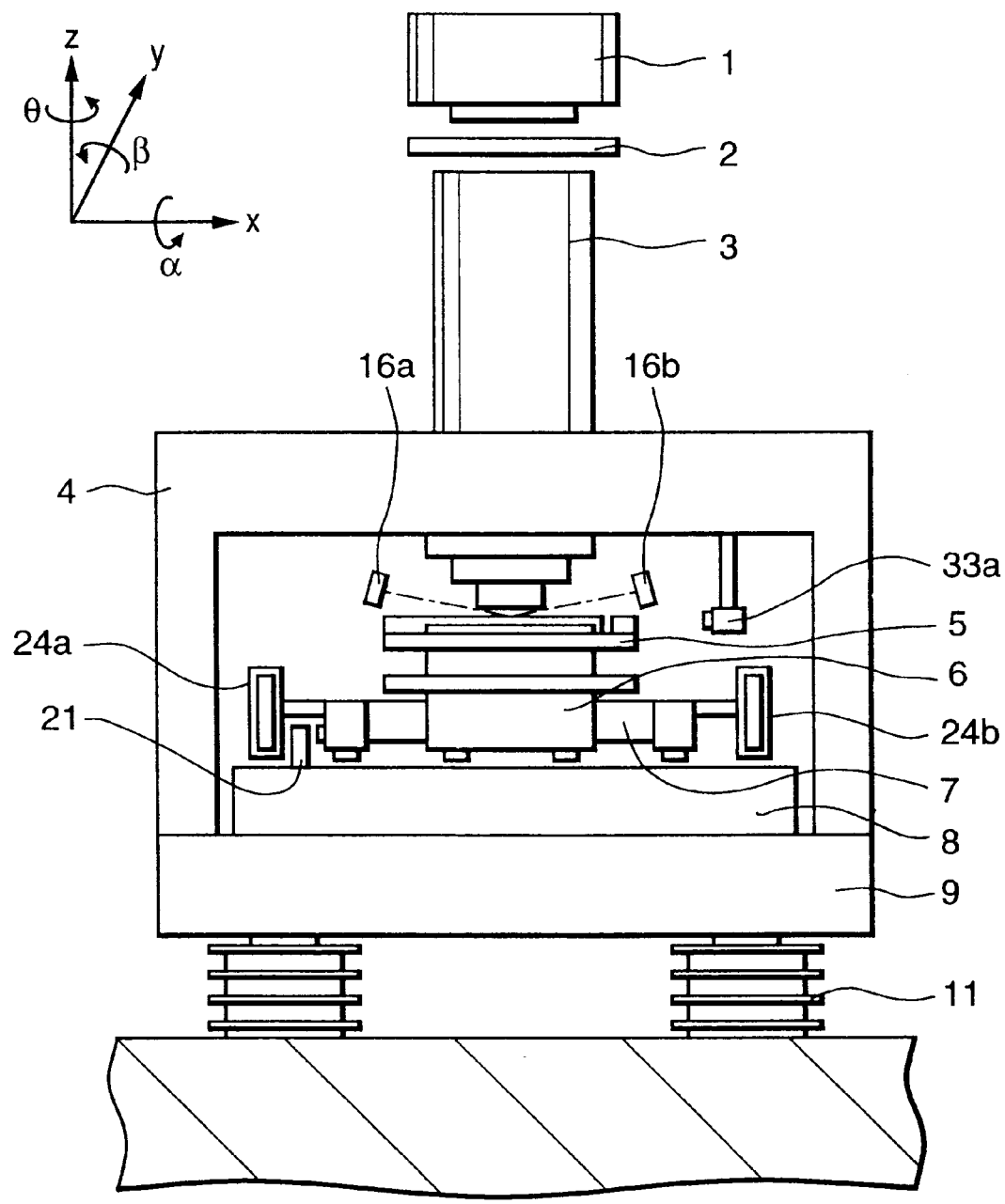
FIG. 24 is a plan view showing a conventional projecting exposure apparatus.

FIG. 23 shows details of the flow in the wafer process. In step 11 (oxidation), the wafer surface is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a photosensitive agent is applied to the wafer. In step 16 (exposure), the circuit pattern of the mask is exposed to the wafer using the exposure apparatus having the above-described alignment apparatus. In step 17 (development), the exposed wafer is developed. In step 18 (etching), the resist which has become unnecessary because etching has been complete is removed. By repeating these steps, a multiple circuit pattern is formed on the wafer. In this embodiment, by appropriately driving and controlling the inertial force application means in each of the repeated processes in the above-described manner, proper alignment is enabled without being affected by the process.

When the producing method of this embodiment is used, a highly integrated device which has been conventionally difficult to manufacture can be manufactured at a low cost.

As has been described above, according to each of the above embodiments, the exciting force generated by the moving acceleration of the stage is canceled by the inertial force application mechanism, so the characteristic vibrations of the entire apparatus and the mechanical system incorporated in the apparatus are not excited. Therefore, the wafer mounted on the stage can be precisely positioned with respect to the projecting lens at a high speed.

In each of the above embodiments, the linear motor is used to drive the stage and the mass bodies. Since rotational motion like a ball screw is not generated, no rotational moment is transmitted to the platform or stage, and disturbance vibration is reduced, so rapid and precise exposure can be performed. In addition, since both the stage and the mass bodies can be driven in a non-contact state, residual vibration of characteristic vibration which is likely to occur in a ball screw can be suppressed. Furthermore, both the stage and the mass bodies are driven by linear motors, so small vibration which can hardly be canceled using different types of driving means can be easily canceled.

When the stage moves, the distribution of supporting force of the plurality of anti-vibration mechanisms changes due to the weight of the stage itself, although the mass body of the inertial force application mechanism cancels the movement of center of gravity of the stage. Therefore, the support force balance of the anti-vibration mechanisms supporting the platform does not change. For this reason, the variation in posture or deformation of the structure of the platform, or the wafer or projecting optical system incorporated in the platform can be prevented, so highly precise positioning can be performed.

In addition, since deformation of the apparatus main body during movement of the stage can be prevented, an increase in cost due to an increase in rigidity and size of the apparatus main body can be suppressed even when the stage becomes large along with an increase in wafer size.

As has been described above, the vibration due to the moving acceleration of the stage in a predetermined direction can be canceled by the inertial force application mechanism for generating a desired inertial force in the predetermined direction. Since the inertial force application mechanism uses movement of a mass body, not only the inertial force due to the moving acceleration of the stage but also a change in center of gravity of the stage can be canceled. Especially, according to the fourth to sixth embodiments, the inertial force application mechanism for generating an inertial force in the second direction can move in the first direction together with the stage. For this reason, vibration generated in moving the stage in the second direction can be reduced by causing the reaction force to directly act on the movable guide. Therefore, rapid and precise positioning can be performed by the positioning apparatus.

In addition, with the rotary inertial force application means for generating a rotational moment, the moment reaction force can be easily canceled. Therefore, the characteristic vibrations of the entire apparatus supported by the air mounts and various portions of the mechanical system incorporated in the apparatus are not excited. Since no disturbance is transmitted to the wafer stage, the laser measurement system, or the focus detection system, rapid and precise positioning can be realized.

Since the exciting force by the moving acceleration of the two-dimensional stage is canceled by the inertial force application mechanism, the characteristic vibrations of the entire apparatus and various portions of the mechanical system incorporated in the apparatus are not excited. Therefore, the stage can be precisely positioned with respect to the exposure optical system at a high speed.

When a plurality of inertial force application mechanisms are arranged, the degree of freedom in designing the arrangement of the inertial force application mechanisms can be increased. For this reason, the axis of action of the force of the stage driving mechanism can be easily made to match that of the inertial force application mechanism.

Since the mass body of the inertial force application mechanism cancels movement of the center of gravity of the stage, the balance of supporting forces of the air mounts supporting the lens-barrel holder and the platform (apparatus main body structure) does not change. Therefore, variation in posture and deformation of the structure of the entire positioning apparatus and the lens-barrel holder can be prevented, so a highly precise semiconductor exposure apparatus is realized.

As many apparently widely different embodiments of the present invention can be made without departing from the spirit and scope thereof, it is to be understood that the invention is not limited to the specific embodiments thereof except as defined in the appended claims.

What is claimed is:

1. A positioning apparatus comprising:
   a platform having a reference surface;
   a movable stage;
   a first linear motor for moving said stage in a predetermined direction; and
   inertial force application means for generating an inertial force, said inertial force application means comprising a mass body, a guide for supporting and guiding said mass body by a static pressure bearing, a second linear motor for moving said mass body, and control means for controlling said second linear motor.

2. The apparatus according to claim 1, wherein said inertial force application means applies the inertial force to said platform so as to cancel a force acting on said platform.

3. The apparatus according to claim 1, wherein said inertial force application means is arranged near a plane of action of the inertial force corresponding to movement of said stage.

4. The apparatus according to claim 1, wherein said inertial force application means includes a plurality of mass bodies.

5. The apparatus according to claim 1, wherein an axis of action of a force of said first linear motor substantially matches an axis of action of a force of said inertial force application means.

6. The apparatus according to claim 1, wherein said mass body has a square pipe shape.

7. An exposure apparatus wherein said positioning apparatus of claim 1 is used for a wafer stage.

8. The apparatus according to claim 7, wherein said platform is arranged on a floor via anti-vibration means, and a projecting optical system is placed on said platform.

9. The apparatus according to claim 7, wherein said platform is arranged on a floor via anti-vibration means, and a projecting optical system is placed on another platform which is set on said floor via another anti-vibration means.

10. A method of manufacturing a device, comprising the steps of:
    providing said exposure apparatus of claim 7; and
    transferring a reticle pattern to a wafer.

11. A method of manufacturing a device, comprising the steps of:
    providing said exposure apparatus of claim 7;
    transferring a reticle pattern to a wafer;
    developing an exposed portion on said wafer; and
    cutting off chips formed on said wafer.

12. A positioning apparatus comprising:
    a stage movable in two axial directions and including a first moving body movable in a first direction on a reference surface of a platform, and a second moving body movable in a second direction perpendicular to the first direction;
    first moving means for moving said first moving body in the first direction;
    second moving means for moving said second moving body in the second direction; and
    first inertial force application means, movable together with said first moving body, for generating a desired inertial force in the second direction.

13. The apparatus according to claim 12, wherein said first inertial force application means comprises a mass body, a guide for supporting and guiding said mass body, mass body moving means for moving said mass body, and control means for controlling said mass body moving means, and moving said mass body in an opposite direction of said second moving body to cancel an inertial force generated by movement of said second moving body.

14. The apparatus according to claim 12, wherein said guide has a static pressure bearing.

15. The apparatus according to claim 12, wherein said moving means comprises a linear motor.

16. The apparatus according to claim 12, wherein an axis of action of a force of said second moving means substantially matches an axis of action of a force of said inertial force application means when viewed from a direction perpendicular to said reference surface of said platform.

17. The apparatus according to claim 12, further comprising second inertial force application means for applying a desired inertial force in the first direction.

18. The apparatus according to claim 12, wherein an axis of action of a force of said first moving means substantially matches an axis of action of a force of said second inertial force application means when viewed from a direction perpendicular to said reference surface.

19. The apparatus according to claim 12, wherein said first and second inertial force application means move mass bodies for applying an inertial force substantially simultaneously with movement of said first or second moving body so as to reduce a change in center of gravity or inertial force generated by movement of said first or second moving body.

20. The apparatus according to claim 12, wherein at least one of said first and second inertial force application means includes a plurality of mass bodies.

21. The apparatus according to claim 12, further comprising measurement means for obtaining position information or acceleration information of said first and second moving bodies, and wherein said first and second inertial force application means control movement of mass bodies for applying an inertial force on the basis of the information obtained by said measurement means.

22. The apparatus according to claim 12, wherein said measurement means comprises a laser interferometer.

23. An exposure apparatus wherein said positioning apparatus of claim 12 is used for a wafer stage.

24. The apparatus according to claim 23, wherein said platform is arranged on a floor via anti-vibration means, and a projecting optical system is placed on said platform.

25. The apparatus according to claim 23, wherein said platform is arranged on a floor via anti-vibration means, and a projecting optical system is placed on another platform which is set on said floor via another anti-vibration means.

26. A method of manufacturing a device, comprising the steps of:
providing said exposure apparatus of claim 23, and
transferring a reticle pattern to a wafer.

27. A method of manufacturing a device, comprising the steps of:
providing said exposure apparatus of claim 23,
transferring a reticle pattern to a wafer;
developing an exposed portion on said wafer; and
cutting off chips formed on said wafer.

28. A positioning apparatus comprising:
a platform having a reference surface;
a movable stage;
moving means for moving said stage in a predetermined direction; and
force application means for generating a force, said force application means comprising translating inertial force application means for generating a translating inertial force and rotational force application means for generating a rotational moment.

29. The apparatus according to claim 28, wherein at least one of said translating inertial force application means and said rotational force application means applies an inertial force to said platform so as to cancel a force acting on said platform.

30. The apparatus according to claim 28, wherein said translating inertial force application means comprises a mass body, a guide for supporting and guiding said mass body, mass body moving means for moving said mass body, and control means for controlling said mass body moving means.

31. The apparatus according to claim 28, wherein a guide of said translating inertial force application means has a static pressure air bearing.

32. The apparatus according to claim 28, wherein said moving means comprises a linear motor.

33. The apparatus according to claim 28, wherein said rotational force application means is driven and controlled to cancel a rotational torque acting on said platform in accordance with acceleration/deceleration of said stage and said translating inertial force application means.

34. The apparatus according to claim 28, wherein said rotational force application means comprises a rotary mass body, a guide for supporting and guiding said rotary mass body, rotary mass body rotation means for rotating said rotary mass body, and control means for controlling said rotary mass body rotation means.

35. The apparatus according to claim 28, wherein a guide of said rotational force application means has a static pressure bearing.

36. The apparatus according to claim 28, wherein a rotational shaft of said rotary mass body is perpendicular to said reference surface of said platform.

37. An exposure apparatus wherein a positioning apparatus of claim 28 is used for a wafer stage.

38. The apparatus according to claim 37, wherein said platform is arranged on a floor via anti-vibration means, and a projecting optical system is placed on said platform.

39. The apparatus according to claim 37, wherein said platform is arranged on a floor via anti-vibration means, and a projecting optical system is placed on another platform which is set on said floor via another anti-vibration means.

40. A method of manufacturing a device, comprising the steps of:
providing said exposure apparatus of claim 37, and
transferring a reticle pattern to a wafer.

41. A method of manufacturing a device, comprising the steps of:
preparing said exposure apparatus of claim 37,
transferring a reticle pattern to a wafer;
developing an exposed portion on said wafer; and
cutting off chips formed on said wafer.

42. An exposure apparatus comprising:
a projecting optical system for projecting a mask pattern to a wafer;
a support member for supporting said projecting optical system;
a stage movable with respect to said projecting optical system; and driving means for driving said stage, said driving means being vibration-isolated from said support member, wherein a reaction force produced by said driving means is canceled by moving a mass body which is different from said stage.

43. The apparatus according to claim 42, wherein said driving means includes a linear motor.

44. The apparatus according to claim 42, wherein said mass body is vibration-isolated from said supporting member.

45. The apparatus according to claim 42, wherein movement of said mass body is linear.

46. The apparatus according to claim 42, wherein movement of said mass body is rotational.

47. The apparatus according to claim 42, wherein said mass body is guided by a static pressure bearing.

48. The apparatus according to claim 42, further comprising a platform which supports said stage, said platform being supported by first vibration removal means, and said support member being supported by second vibration removal means, which is different from said first vibration removal means.

49. A method of manufacturing a device, comprising the steps of:

providing an exposure apparatus according to claim 42; and transferring a reticle pattern to a wafer using said exposure apparatus.

50. The method according to claim 49, further comprising the steps of:

coating a photosensitive agent onto the wafer; and developing the wafer processed in said transferring step.

* * * * *

UNITED STATES PATENT AND TRADEMARK OFFICE
CERTIFICATE OF CORRECTION

PATENT NO. : 6,028,376

DATED : February 22, 2000

INVENTOR(S) : EIJI OSANAI, ET AL.

Page 1 of 2

It is certified that error appears in the above-identified patent and that said Letters Patent is hereby corrected as shown below:

ON THE COVER PAGE IN ITEM [57] ABSTRACT:
   Line 8, "amass" should read --a mass--.

IN THE DRAWINGS:
SHEET 5:
   Figure 5, "MASSBODY" should read --MASS BODY--.

SHEET 22:
   Figure 22, "(PREPROCESS)" should read --(PRE-PROCESS)--.

IN THE DISCLOSURE:
COLUMN 2:
   Line 59, "cleanness" should read --cleanliness--.

COLUMN 6:
   Line 60, "apredetermined" should read --a predetermined--.

COLUMN 9:
   Line 7, "(x," should read --(x,--.

COLUMN 14:
   Line 66, "6is" should read --6 is--

UNITED STATES PATENT AND TRADEMARK OFFICE
CERTIFICATE OF CORRECTION

PATENT NO. : 6,028,376

DATED : February 22, 2000

INVENTOR(S) : EIJI OSANAI, ET AL.

It is certified that error appears in the above-identified patent and that said Letters Patent is hereby corrected as shown below:

COLUMN 18:
   Line 59, "center" should read --the center--.

COLUMN 21:
   Line 51, "claim 23 should read --claim 23-- .
   Line 43, "claim 23," should read --claim 23;--.
   Line 55, "claim 23," should read --claim 23;--.

COLUMN 22:
   Line 56, "preparing" should read --providing--; and "claim 37," should read --claim 37;--.

Signed and Sealed this

Thirteenth Day of March, 2001

*Attest:*

NICHOLAS P. GODICI

*Attesting Officer*     *Acting Director of the United States Patent and Trademark Office*